(12) United States Patent
Fukui et al.

(10) Patent No.: US 9,601,351 B2
(45) Date of Patent: Mar. 21, 2017

(54) METHOD OF MANUFACTURING A SEMICONDUCTOR DEVICE

(71) Applicant: Renesas Electronics Corporation, Kanagawa (JP)

(72) Inventors: Yuki Fukui, Kanagawa (JP); Hiroaki Katou, Kanagawa (JP)

(73) Assignee: RENESAS ELECTRONICS CORPORATION, Kanagawa (JP)

(*) Notice: Subject to any disclaimer, the term of this patent is extended or adjusted under 35 U.S.C. 154(b) by 0 days.

(21) Appl. No.: 14/552,954

(22) Filed: Nov. 25, 2014

(65) Prior Publication Data

US 2015/0079745 A1    Mar. 19, 2015

Related U.S. Application Data

(62) Division of application No. 13/470,859, filed on May 14, 2012, now Pat. No. 8,969,951.

(30) Foreign Application Priority Data

Jun. 9, 2011  (JP) .................................. 2011-128896

(51) Int. Cl.
*H01L 21/324* (2006.01)
*H01L 29/417* (2006.01)
(Continued)

(52) U.S. Cl.
CPC ...... *H01L 21/324* (2013.01); *H01L 29/41741* (2013.01); *H01L 29/66666* (2013.01);
(Continued)

(58) Field of Classification Search
CPC ............................. H01L 21/324; H01L 29/66
See application file for complete search history.

(56) References Cited

U.S. PATENT DOCUMENTS

| 6,507,088 B2 | 1/2003 | Yoneda |
| 7,439,137 B2 | 10/2008 | Ishida et al. |

(Continued)

FOREIGN PATENT DOCUMENTS

| CN | 1315746 | 10/2001 |
| CN | 1700430 | 11/2005 |

(Continued)

OTHER PUBLICATIONS

Chinese Office Action, dated Apr. 29, 2015 in corresponding Chinese Patent Application No. 201210191125.8.

(Continued)

*Primary Examiner* — Asok K Sarkar
*Assistant Examiner* — Dmitriy Yemelyanov
(74) *Attorney, Agent, or Firm* — Young & Thompson

(57) ABSTRACT

The generation of a variation in properties of vertical transistors is restrained. A vertical MOS transistor is formed in a semiconductor substrate. A first interlayer dielectric film and a first source wiring are formed over the front surface of the substrate. The first source wiring is formed over the first interlayer dielectric film, and is overlapped with the vertical MOS transistor as viewed in plan. Contacts are buried in the first interlayer dielectric film. Through the contacts, an n-type source layer of vertical MOS transistor is coupled with the first source wiring. Openings are made in the first source wiring.

3 Claims, 29 Drawing Sheets

(51) Int. Cl.
*H01L 29/78* (2006.01)
*H01L 29/66* (2006.01)
*H01L 21/8234* (2006.01)
*H01L 27/092* (2006.01)

(52) U.S. Cl.
CPC .. *H01L 29/7813* (2013.01); *H01L 21/823487* (2013.01); *H01L 27/0922* (2013.01); *H01L 2924/0002* (2013.01)

(56) References Cited

U.S. PATENT DOCUMENTS

| | | | |
|---|---|---|---|
| 7,799,646 B2 | 9/2010 | Su et al. | |
| 7,952,144 B2 | 5/2011 | Su et al. | |
| 8,304,315 B2 | 11/2012 | Su et al. | |
| 8,314,459 B2 | 11/2012 | Kitamura | |
| 2001/0023967 A1* | 9/2001 | Yoneda | H01L 27/0251 257/393 |
| 2005/0255706 A1* | 11/2005 | Ishida | H01L 21/3003 438/758 |
| 2009/0250770 A1* | 10/2009 | Su | H01L 21/8234 257/401 |

FOREIGN PATENT DOCUMENTS

| | | |
|---|---|---|
| CN | 101556956 | 10/2009 |
| JP | 9129868 | 5/1997 |
| JP | 9-326490 | 12/1997 |
| JP | 2003-218231 | 7/2003 |
| JP | 2005327799 | 11/2005 |
| JP | 2011071147 | 4/2011 |

OTHER PUBLICATIONS

Japanese Office Action, dated Dec. 24, 2014, in corresponding Japanese Patent Application No. 2011-128896.

* cited by examiner

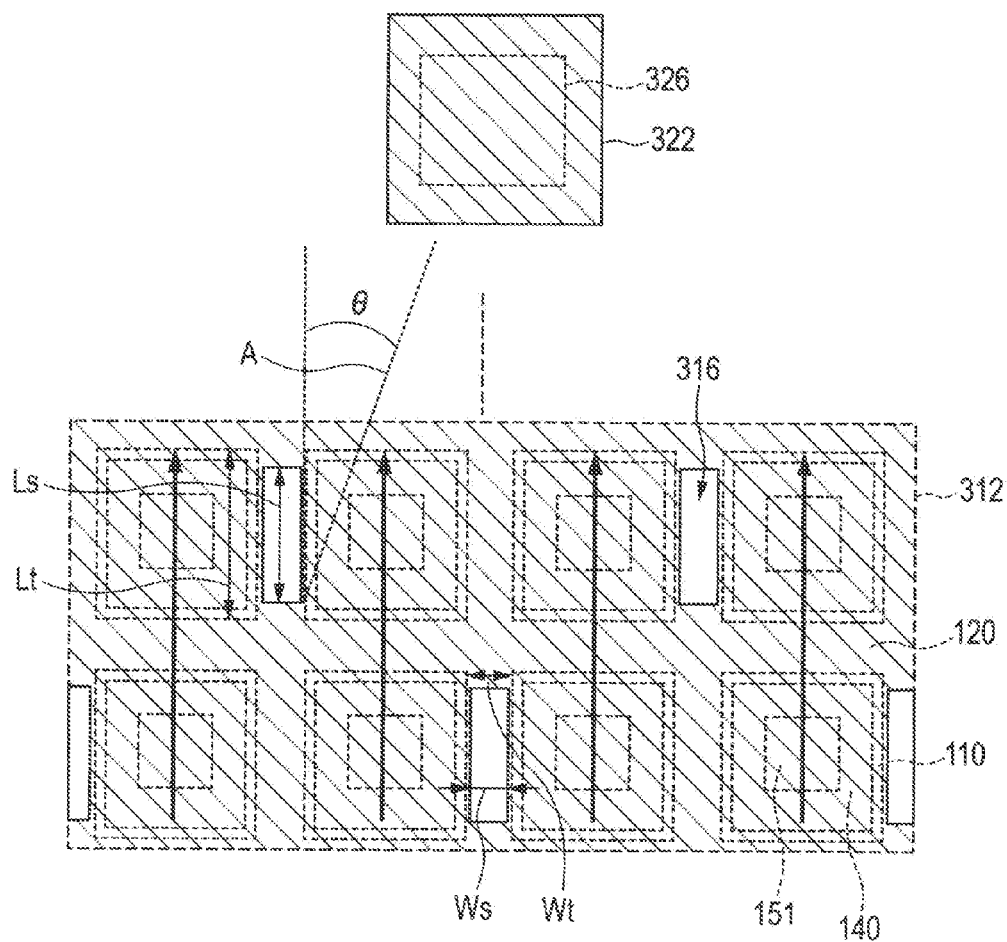

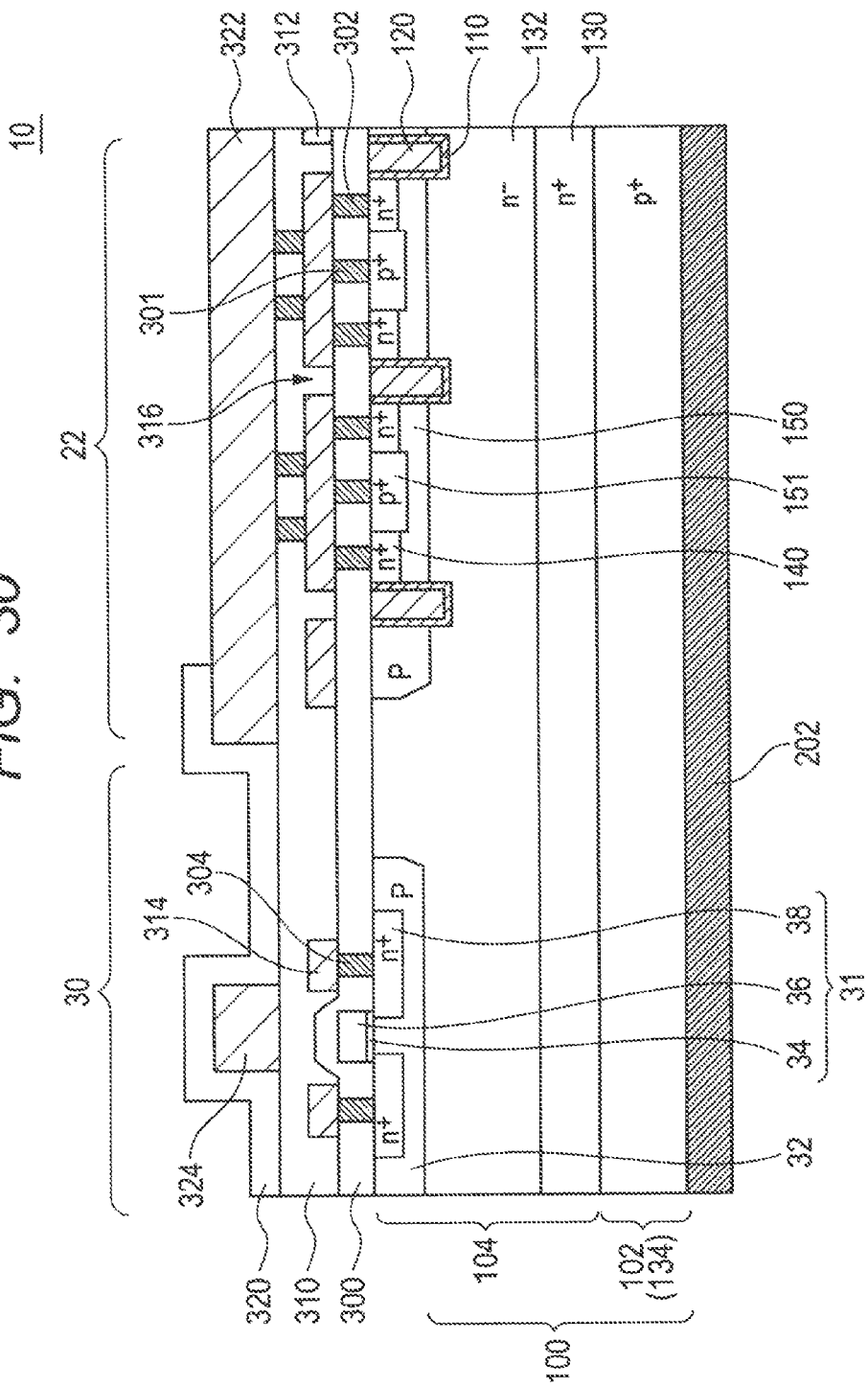

METHOD OF MANUFACTURING A SEMICONDUCTOR DEVICE

CROSS-REFERENCE TO RELATED APPLICATIONS

The disclosure of Japanese Patent Application No. 2011-128896 filed on Jun. 9, 2011 including the specification, drawings and abstract is incorporated herein by reference in its entirety.

BACKGROUND

The present invention relates to a semiconductor device having a vertical transistor, and a method of manufacturing the same.

As a semiconductor device, known is a semiconductor device having vertical transistors. A vertical transistor is used in, for example, an element for controlling a large electric current. As described in, for example, Patent Literature 1 (listed up below), a vertical transistor has a structure having an n-layer which is to be a drain, a p-layer which is formed on the n-layer and is to be a channel layer, and an n-layer which is formed on the front surface of the p-layer and is to be a source. In a device described in Patent Literature 1, a planar MOS transistor is formed in the same substrate in which the vertical transistor is formed. This planar MOS transistor is configured as a control circuit of a power device section made of the vertical transistor.

Patent Literature 2 (see below) states that when a planar MOS transistor is subjected to hydrogen annealing treatment, the MOS transistor recovers from damages which the MOS transistor receives in the manufacturing method thereof.

CITATION LIST

Patent Literatures

Patent Literature 1: Japanese Patent Application Laid-Open No. 2003-218231
Patent Literature 2: Japanese Patent Application Laid-Open No. Hei 9 (1997)-326490

SUMMARY

When a vertical transistor is subjected to annealing treatment with a reducing gas such as hydrogen, dangling bonds of the semiconductor are bonded to hydrogen, so as to be terminated. Thus, the property of the transistor is stabilized.

However, the inventors have made investigations to make it clear that even when vertical transistors are subjected to annealing treatment with a reducing gas such as hydrogen, the transistors are varied in properties.

According to the present invention, provided is a semiconductor device including the following: a semiconductor substrate having at least two surfaces opposite to each other; a vertical transistor that is formed in the semiconductor substrate, and that has a gate electrode and a source layer at one surface side of the two surface sides of the semiconductor substrate and has a drain layer at the other surface side of the semiconductor substrate; a first interlayer dielectric film formed over the one surface of the semiconductor substrate; a first source wiring that is formed over the first interlayer dielectric film and overlapped with the vertical transistor as the source wiring is viewed in plan, and that has plural openings; and a contact through which the first source wiring is coupled with the source layer of the vertical transistor.

The vertical transistor is used for an element for controlling a large current. Thus, it is necessary to secure the area of the first source wiring. For this reason, the first source wiring is overlapped with the vertical transistor as viewed in plan. The inventors' investigations have demonstrated that even when any related-art workpiece is subjected to annealing treatment with a reducing gas such as hydrogen, the reducing gas does not easily reach the front surface of its semiconductor substrate since its first source wiring is overlapped with its vertical transistor. On the other hand, in the invention, the first source wiring has the openings; therefore, the reducing gas easily reaches the front surface of the semiconductor substrate by way of the openings. As a result, vertical transistors of the invention can be restrained from being varied from each other in properties.

According to the invention, provided is also a method of manufacturing a semiconductor device, including the steps of forming, in a semiconductor substrate having at least two surfaces opposite to each other, a vertical transistor including a gate electrode and a source layer at one surface side of the two surface sides of the semiconductor substrate, and including a drain layer at the other surface side of the semiconductor substrate; forming a first interlayer dielectric film over the one surface of the semiconductor substrate; forming, in the first interlayer dielectric film, a contact coupled with the source layer of the vertical transistor, forming, over the first interlayer dielectric film, a first source wiring overlapped with the vertical transistor as viewed in plan and coupled with the contact, and further making openings in the first source wiring; and conducting a treatment with a reducing gas, thereby subjecting the vertical transistor to a first reducing treatment.

According to the invention, vertical transistors can be restrained from being varied from each other in properties.

BRIEF DESCRIPTION OF THE DRAWINGS

FIG. 10 is a view referred to in order to describe the direction of long sides of one of the openings, and an advantageous effect based on the specified direction.

FIG. 30 is a view illustrating the structure of a semiconductor device according to a ninth embodiment of the invention.

DETAILED DESCRIPTION

With reference to the drawings, embodiments of the invention will be described hereinafter. In all of the drawings, reference numbers equal or equivalent to each other are attached to constituting elements or portions equal or equivalent to each other, and overlapped description will be omitted as the case may be.

First Embodiment

Figure 1:
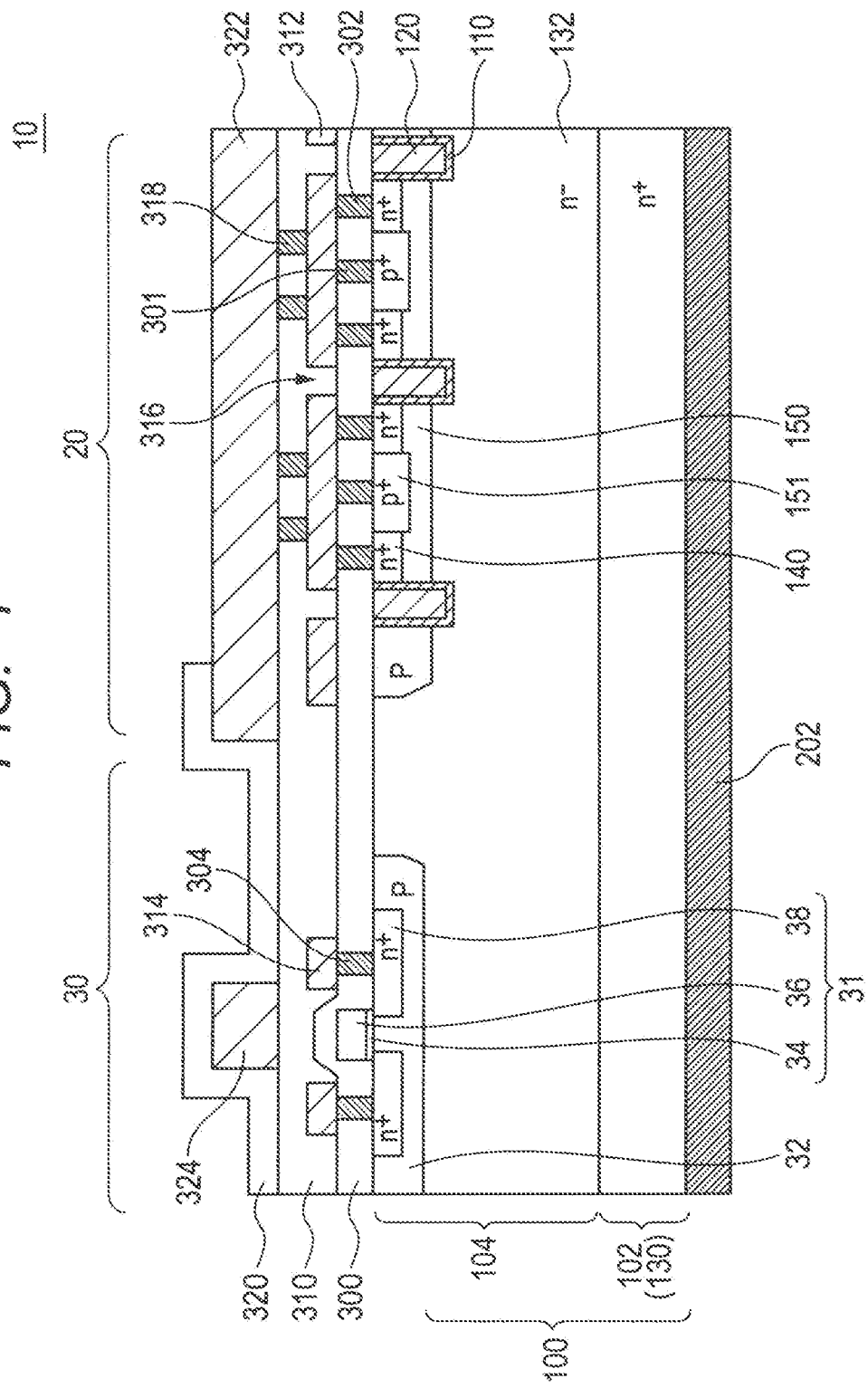
FIG. 1 is a view illustrating the structure a semiconductor device according to a first embodiment of the invention.

FIG. 1 is a view illustrating the structure of a semiconductor device 10 according to a first embodiment. This semiconductor device has a vertical MOS transistor 20. The vertical MOS transistor 20 is formed by use of a semiconductor substrate 100, and has an n-type drain layer 130, a p-type base layer 150, a gate insulator film 110, a gate electrode 120, and an n-type source layer 140. The n-type drain layer 130 is formed in the semiconductor substrate 100, and positioned at the rear surface side of the semiconductor substrate 100. The p-type base layer 150 is formed in the semiconductor substrate 100, and positioned over the n-type drain layer 130. In the semiconductor substrate 100, a depression is formed. The depression is formed in the p-type base layer 150. The lower end of the depression is positioned below the p-type base layer 150. The gate insulator film 110 is formed on any inner wall and the bottom surface of the depression. The gate electrode 120 is buried in the depression. The n-type source layer 140 is formed in the p-type base layer 150 more shallowly than the p-type base layer 150. The n-type source layer 140 is positioned adjacently to the depression as viewed in plan.

A first interlayer dielectric film 300 and a first source wiring 312 are formed over the front surface of the semiconductor substrate 100. The first source wiring 312 is formed on the first interlayer dielectric film 300, and overlaps with the vertical MOS transistor 20 as viewed in plan. Contacts 302 are buried in the first interlayer dielectric film 300. Through the contacts 302, the n-type source layer 140 of the vertical MOS transistor 20 is coupled with the first source wiring 312. In the first source wiring 312, openings 316 are made. Hereinafter, the device will be described in more detail.

The semiconductor substrate 100 is a substrate obtained by forming an epitaxial layer 104 onto a sub-substrate 102. The sub-substrate 102 is, for example, an $n^+$-type silicon substrate, and the epitaxial layer 104 is, for example, an $n^-$-type silicon layer. The sub-substrate 102 functions as the n-type drain layer 130. A drain electrode 202 is formed on the rear surface of the sub-substrate 102. The p-type base layer 150 is formed by implanting a p-type impurity into the epitaxial layer 104. The region of the epitaxial layer 104 where the p-type base layer 150 is not formed functions as an $n^-$ layer to be positioned between the n-type drain layer 130 and the p-type base layer 150.

On the front surface of the p-type base layer 150 is formed a p-type layer 151. The p-type layer 151 is laid to give a reference voltage to the p-type base layer 150. The lower end of the p-type layer 151 is coupled with the p-type base layer 150. Specifically, the p-type layer 151 is formed on the region of the p-type base layer 150 front surface where the n-type source layer 140 is not formed. The p-type layer 51 is deeper than the n-type source layer 140. The impurity concentration in the p-type layer 151 is higher than that in the p-type base layer 150.

An element isolation film (not illustrated) is formed on the front surface of the epitaxial layer 104. This element isolation film is formed through, for example, a LOCUS process. Inside surrounds of the element isolation film, a depression in which the gate electrode 120 is to be buried, and the n-type source layer 140 are made. The depression is made into a trench form, and the n-type source 140 is positioned on both sides of this trench. The lower end of the depression is positioned in the $n^-$ layer 132 and not to reach the n-type drain layer 130. The gate electrode 120 is made of, for example, polysilicon, and the upper end thereof is positioned at a level equal to the front surface of the semiconductor substrate 100, or below the front surface.

The semiconductor substrate 100 has a power control region where the vertical MOS transistor 20 is formed, and a logic region where a control circuit 30 is formed. The control circuit 30 has a planar transistor 31. The MOS transistor 31 is formed in a portion of the semiconductor substrate 100 which is positioned in the logic region. When the MOS transistor 31 is of an n-type, the transistor 31 is formed in a p-type well 32 made in the epitaxial layer 104 to have a gate insulator film 34, a gate electrode 36, and an impurity region 38 which is to be a source and a drain. When the MOS transistor 31 is of a p-type, the n-type epitaxial layer 104 may be used, as it is, as a well. The impurity region 38 may have an extension region. In this case, on any side surface of the gate electrode 36, a side wall is formed.

The first interlayer dielectric film 300 is formed on the semiconductor substrate 100. The first interlayer dielectric film 300 is, for example, an insulator film made mainly of $SiO_2$, such as a BPSG film. On the first interlayer dielectric film 300 are formed the first source wiring 312 and a wiring 314.

The first source wiring 312 is positioned in the power control region. As viewed in plan, the wiring 312 covers substantially the whole of the vertical MOS transistor 20. In the first source wiring 312, the openings 316 are made. In the present embodiment, the openings 316 are positioned on the gate electrode 120. The openings 316 are arranged in accordance with a predetermined rule. This rule will be detailed later. The width of the first source wiring 312 is preferably set to 0.6 μm or more in order to restrain the generation of migration. It is preferred to set the intervals between the openings to be matched with these matters (including the rule) as much as possible. The wiring 314 is positioned in the logic region to form a logic circuit. The first source wiring 312 and the wiring 314 are formed through the same step. The film thickness of the first source wiring 312 and that of the wiring 314 are each set into the range of, for example, 0.4 to 1.0 μm inclusive in order to work the wirings easily.

The contacts 302, and contacts 301 and 304 are buried in the first interlayer dielectric film 300. Through any one of the contacts 301, the p-type layer 151 is coupled with the first source wiring 312. Through any one of the contacts 302, the n-type source layer 140 of the vertical MOS transistor 20 is coupled with the first source wiring 312. The contacts 302 are formed through a step different from the step of forming the first source wiring 312. Through any one of the contacts 304, the impurity region 38 of the MOS transistor 31 is coupled with the wiring 314. The contacts 304 are formed in the same step for forming the contacts 301 and 302.

A second interlayer dielectric film 310 is formed on the first interlayer dielectric film 300, the first source wiring 312, and the wiring 314. The second interlayer dielectric film 310 is, for example, an insulator film made mainly of $SiO_2$, such as a BPSG film. On the second interlayer dielectric film 310 are formed a second source wiring 322 and a logic wiring 324. The film thickness of the second source wiring 322 and that of the logic wiring 324 are each larger than the film thickness of each of the first source wiring 312 and the wiring 314. The film thickness of the second source wiring 322 and that of the logic wiring 324 are each set into the range of, for example, 2.0 to 6.0 μm inclusive in order to make the resistance values thereof low.

The second source wiring 322 overlaps with the vertical MOS transistor 20 as viewed in plan. In the present embodiment, the second source wiring 322 covers substantially the whole of the vertical MOS transistor 20 as viewed in plan. The second source wiring 322 is a solid film. Vias 318 are buried in the second interlayer dielectric film 310. The second source wiring 322 is coupled through the vias 318 with the first source wiring 312. The vias 318 are made of, for example, W.

The logic wiring 324 is positioned in the logic region, and is coupled through vias (not illustrated) buried in the second interlayer dielectric film 310 with the wiring 314. In other words, the logic wiring 324 is configured as (or for) the control circuit 30. The wiring-density of the logic wiring 324 is lower than the plane wiring-density of the second source wiring 322. In other words, the logic wiring 324 has, between its wiring moieties, many gaps as viewed in plan.

Figure 12:
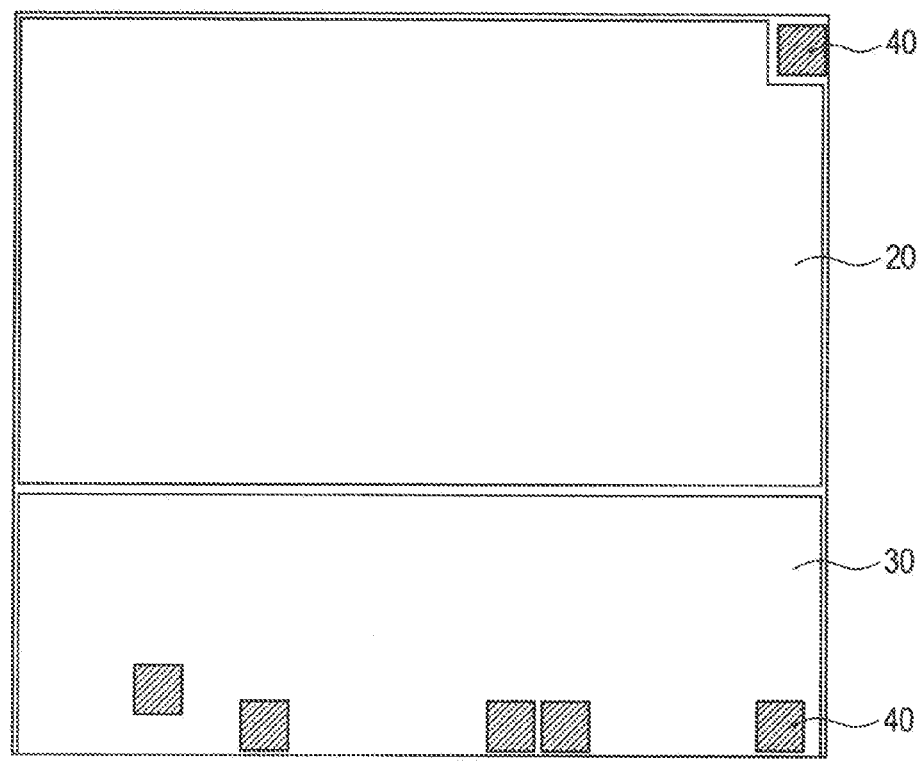
FIG. 12 is a plan view of the semiconductor device illustrated in FIG. 11.

Electrode pads 40, which will be detailed later with reference to FIG. 12, are formed on the same layer as forms the second source wiring 322 and the logic wiring 324. The electrode pads 40 are coupled with the logic wiring 324. The second source wiring 322 partially functions as an electrode pad 326 (see FIG. 10).

On the logic wiring 324 and the second source wiring 322 is formed a protective insulator film 320. The protective insulator film 320 is, for example, a silicon nitride film. The protective insulator film 320 covers the entire upper surface of the logic wiring 324. However, the film 320 does not cover the electrode pads 40, the electrode pad 326, nor a portion of the second source wiring 322.

In the embodiment, the first source wiring 312, the wiring 314, the second source wiring 322, and the logic wiring 324 are each made of Al or an Al alloy. The contacts 302 and the vias 318 are made of W.

Figure 2:
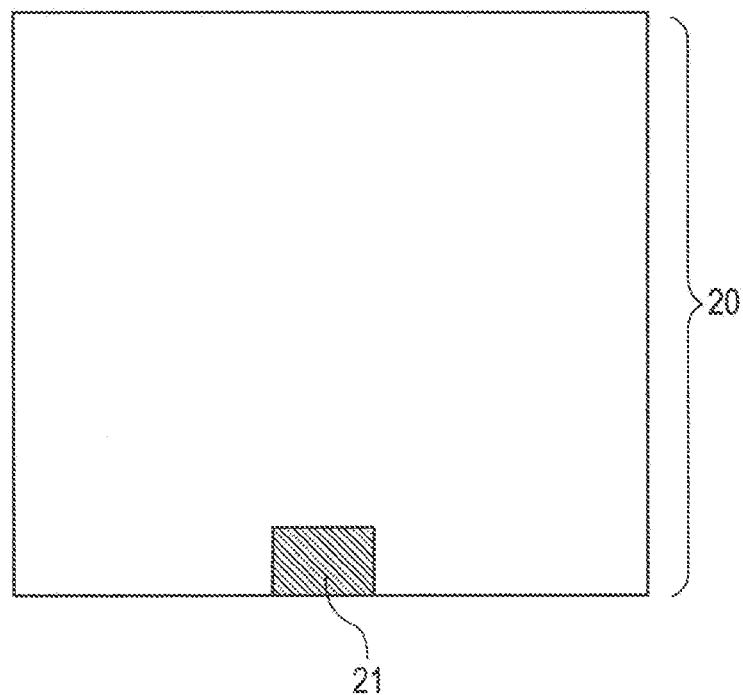
FIG. 2 is a plan view of a vertical MOS transistor.

FIG. 2 is a plan view of the vertical MOS transistor 20. In a portion of the vertical MOS transistor 20, a vertical transistor 21 for sensing is formed. The sensing vertical transistor 21 is used to inspect properties of the vertical MOS transistor 20. The sensing vertical transistor 21 has the same structure as the vertical MOS transistor 20; however, the transistor 21 is small in planar shape. The ratio by area of the vertical MOS transistor 20 to the sensing vertical transistor 21 is, for example, from 500 to 50000 inclusive.

Figure 3:
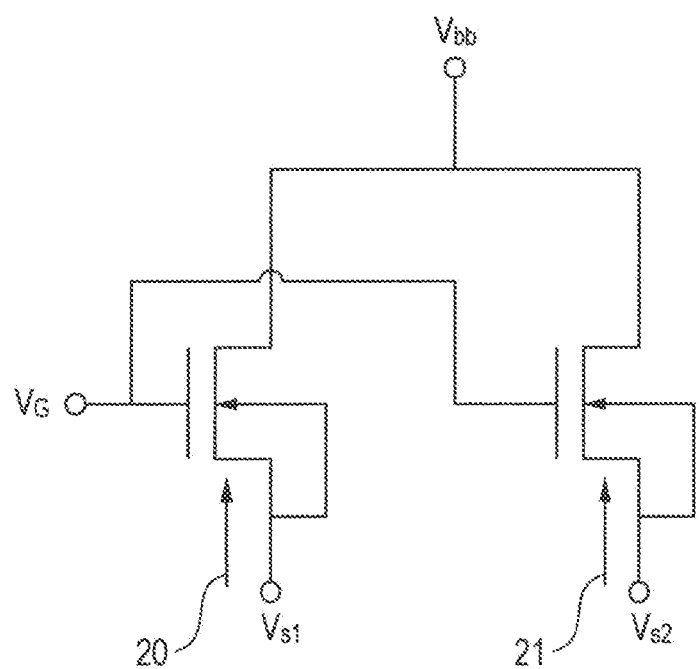
FIG. 3 is a circuit diagram showing a relationship between the vertical MOS transistor and a sensing vertical transistor concerned therewith.

FIG. 3 is a circuit diagram showing a relationship between the vertical MOS transistor 20 and the sensing vertical transistor 21. As illustrated in FIG. 3, the sensing vertical transistor 21 is arranged in parallel to the vertical MOS transistor 20. The source voltage Vs1 of the sensing vertical transistor 21 is equal to the source voltage Vs2 (ground voltage) of the vertical MOS transistor 20.

Figure 4:
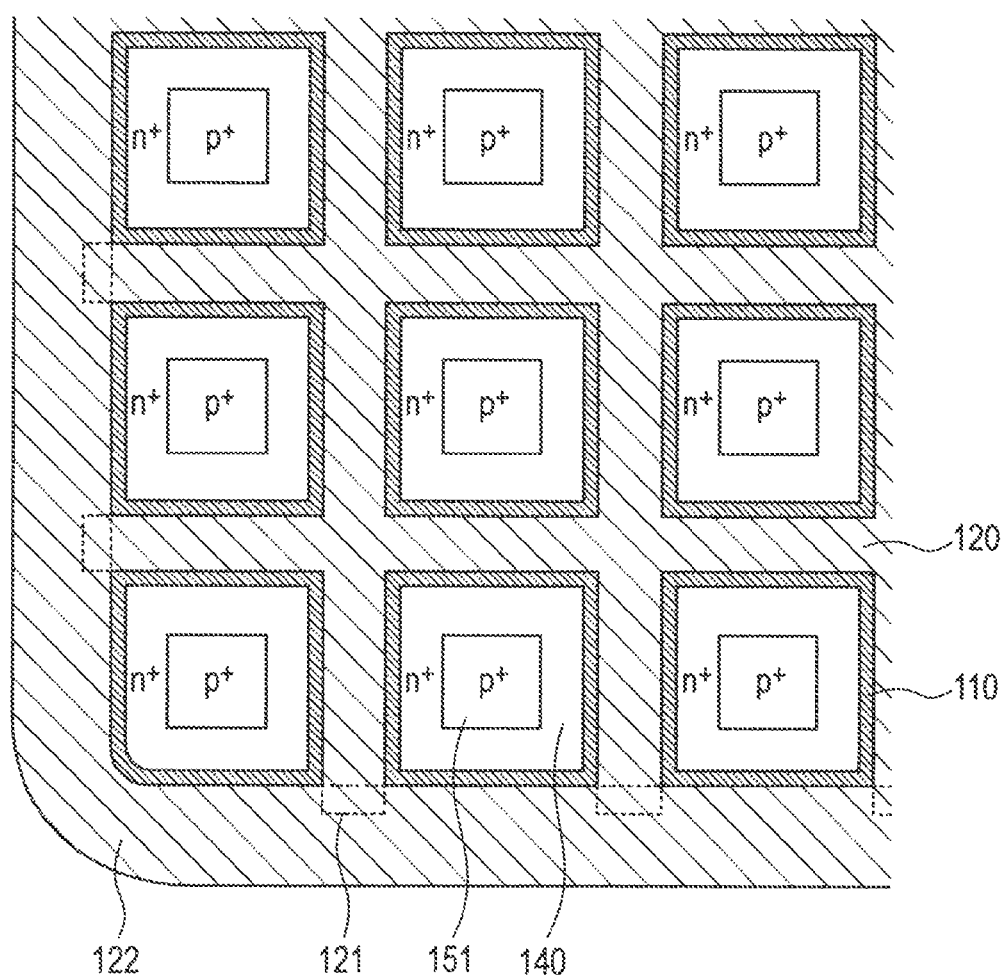
FIG. 4 is a plan view illustrating an arrangement of a gate electrode, an n-type source layer, and a p-type layer.

FIG. 4 is a plan view illustrating an arrangement of the gate electrode 120, the n-type source layer 140, and the p-type layer 151. In the example illustrated in FIG. 4, the respective external shapes the n-type source layers 140 are rectangular as viewed in plan. The p-type layer 151 is formed inside each of the n-type source layers 140. Around the outside of each of the n-type source layers 140, the gate insulator film 110 is formed. The n-type source layers 140 are arranged regularly at lattice points. The gate electrode 120 is led around between the n-type source layers 140. In other words, the gate electrode 120 is led around into a form along frames of checks of the lattice. The n-type source layer 140 and the p-type layer 151 are arranged in individual gaps of the gate electrode 120.

At the outer periphery of the vertical MOS transistor 20, a gate wiring 122 is formed. The gate wiring 122 is formed on the semiconductor substrate 100. As described above, the gate electrode 120 is buried in the depression made in the semiconductor substrate 100. Ends 121 of the gate electrode 120 are positioned under the gate wiring 122. In other words, the gate wiring 122 is coupled through the ends 121 of the gate electrode 120 with the gate electrode 120. The gate wiring 122 is also made of the same material as used for the gate electrode 120, for example, polysilicon.

Figure 5:
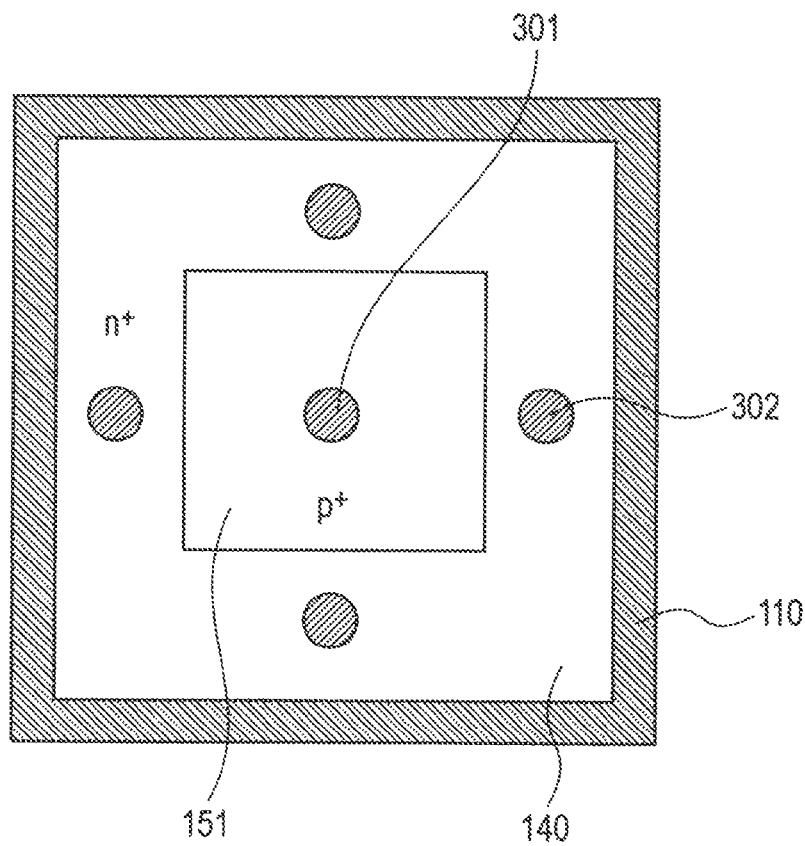
FIG. 5 is a view illustrating a positional relationship between the n-type source layer and the p-type layer, and contacts.

FIG. 5 is a view illustrating a positional relationship between the n-type source layer 140 and the p-type layer 151, and the contacts 302. As has been described with reference to FIG. 1, the n-type source layer 140 is coupled through the contacts 302 with the first source wiring 312, and the p-type layer 151 is coupled through the contacts 301 with the first source wiring 312. In the example illustrated in FIG. 5, only one contact 301 is located, and plural contacts 302 are located at regular intervals to surround a p-type layer 151. However, the arrangement of the contacts 301 and 302 is not limited to the example illustrated in this figure.

Figure 6:
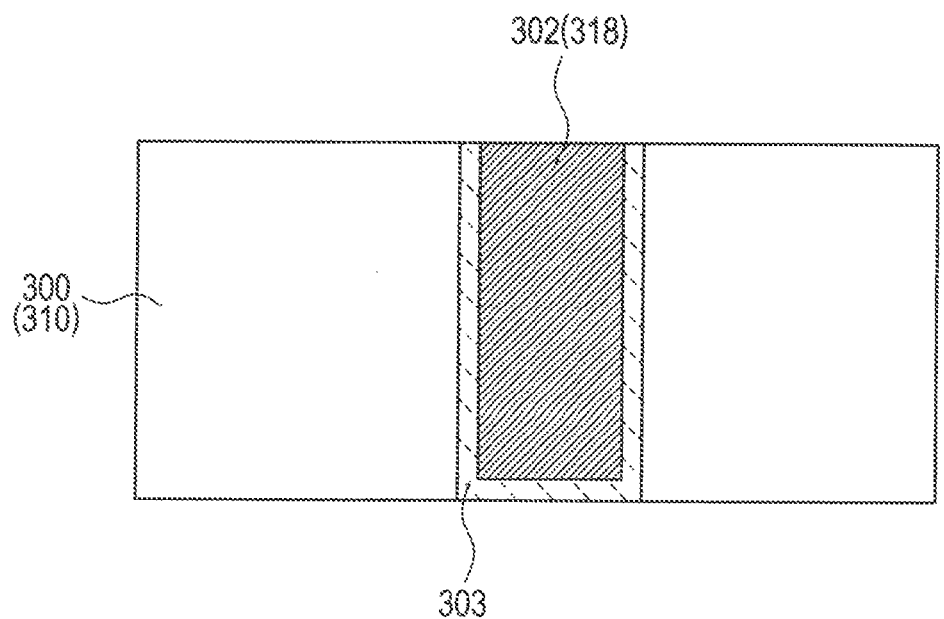
FIG. 6 is a sectional view illustrating the structure of any one of the contacts.

FIG. 6 is a sectional view illustrating the structure of any one of the contacts 302. The contact 302 is buried in a through hole made in the first interlayer dielectric film 300. The side wall of this through hole and a bottom surface for this through hole are covered with a barrier metal 303. The barrier metal 303 has, for example, a structure in which TiN is stacked on Ti.

The contacts 301 and the vias 318 each have the same structure as the contact 302 illustrated in FIG. 6.

Figure 7:
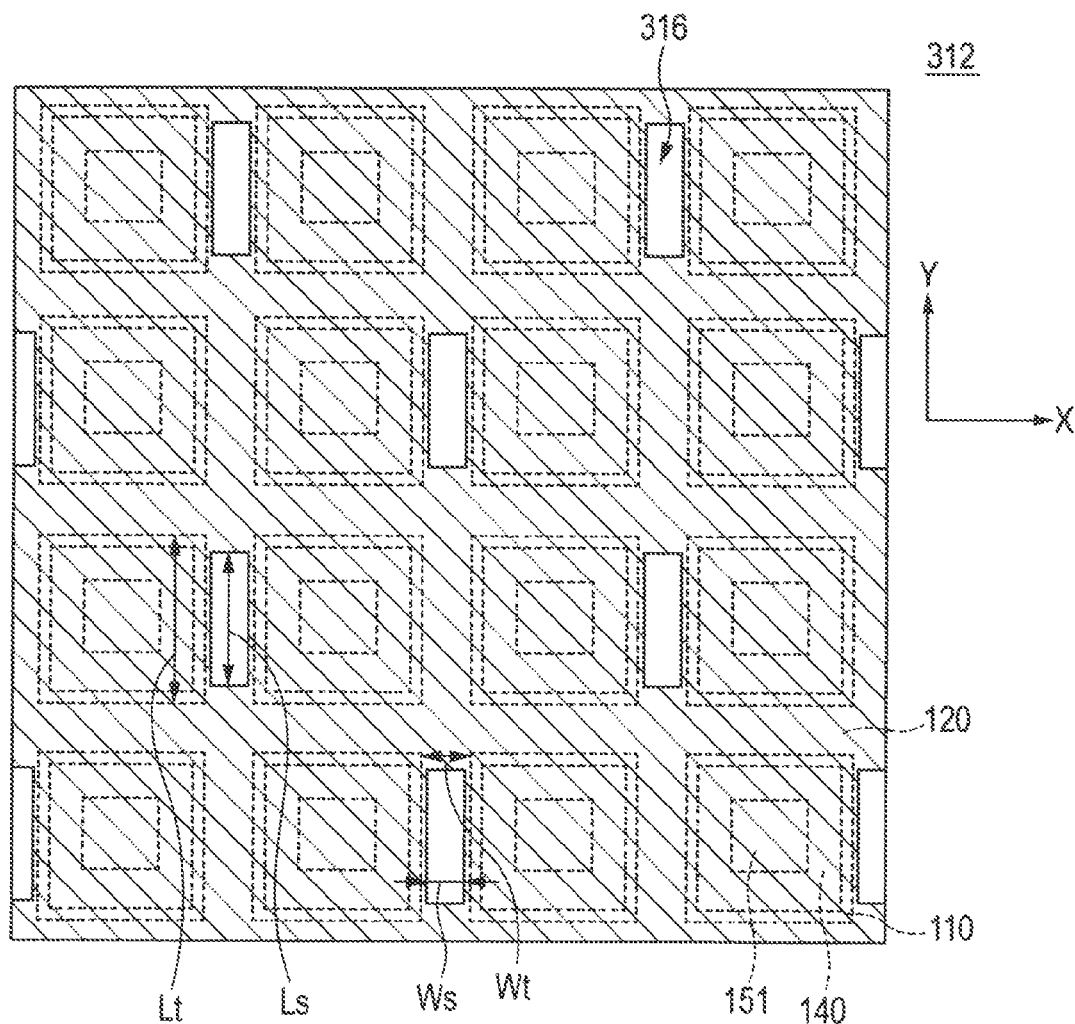
FIG. 7 is a view illustrating a planar layout of a first source wiring and openings.

FIG. 7 is a view illustrating a planar layout of the first source wiring 312 and the openings 316 together with the gate electrode 120, the gate insulator film 110, the n-type source layer 140 and the p-type layer 151. The first source wiring 312 covers the vertical MOS transistor 20. The openings 316 are made in the first source wiring 312. The openings 316 are positioned over the gate electrode 120.

The planar shape of the openings is rectangular. The long sides of the openings 316 are along the direction in which the gate electrode 120 is extended (the Y direction in FIG. 7). The length Ls of the long sides of the openings 316 is equal to or somewhat shorter than the interval Lt between any adjacent two out of individual moieties of the gate electrode 120. The length Ws of the short sides of the openings 316 is equal to or somewhat shorter than the width Wt of the moieties of the gate electrode 120.

Figure 8:
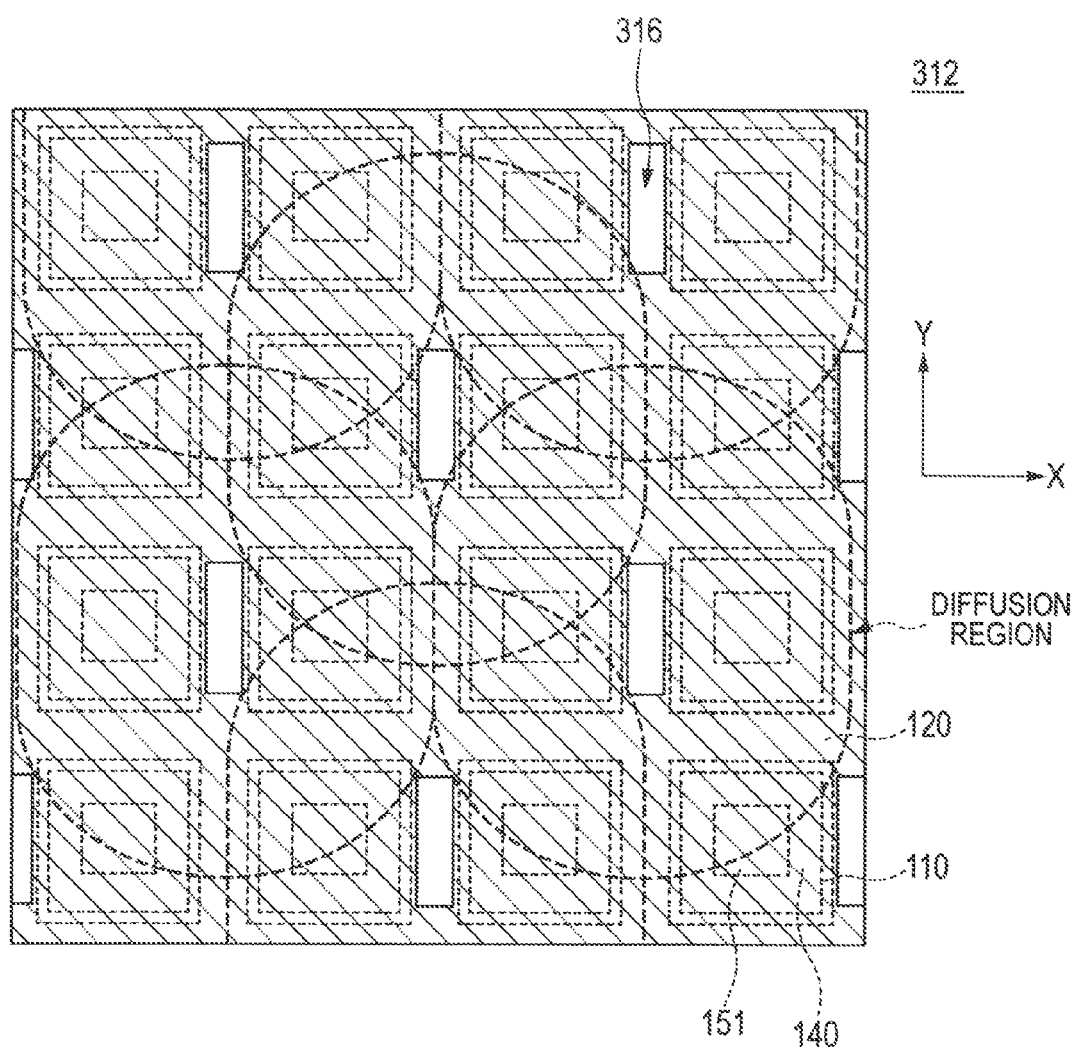
FIG. 8 is a view referred to in order to describe a method for deciding the arrangement pattern of the openings.

FIG. 8 is a view referred to in order to describe a method for deciding the arrangement pattern of the openings 316. In the same manner as illustrated in FIG. 7, in an example illustrated in FIG. 8, openings 316 are arranged into a cross-woven lattice form (or a zigzag or staggered form). Specifically, a gate electrode 120 is extended to each of x and y directions in this figure to form a lattice. The openings 316 are arranged only along portions of the gate electrode 120 which are extended in the y direction. It is determined, on the basis of the diffusing distance of the reducing gas concerned (see just below), what density the openings 316 should be arranged to have.

The openings 316 are made to cause a reducing gas, such as hydrogen, to reach the front surface of the semiconductor substrate 100. A region of the semiconductor substrate 100 where the gas is diffused from any one of the openings 316 so that reduction with the gas is attained (i.e., a diffusion region) is varied in accordance with the thickness of the first interlayer dielectric film 300, and conditions for the process such as conditions for annealing for the diffusion. The arrangement pattern of the openings 316 is decided in such a manner that any position of the entire region of the semiconductor substrate 100 where the vertical MOS transistor 20 is formed can be contained in the diffusion region of any one of the openings 316.

Figure 9A:
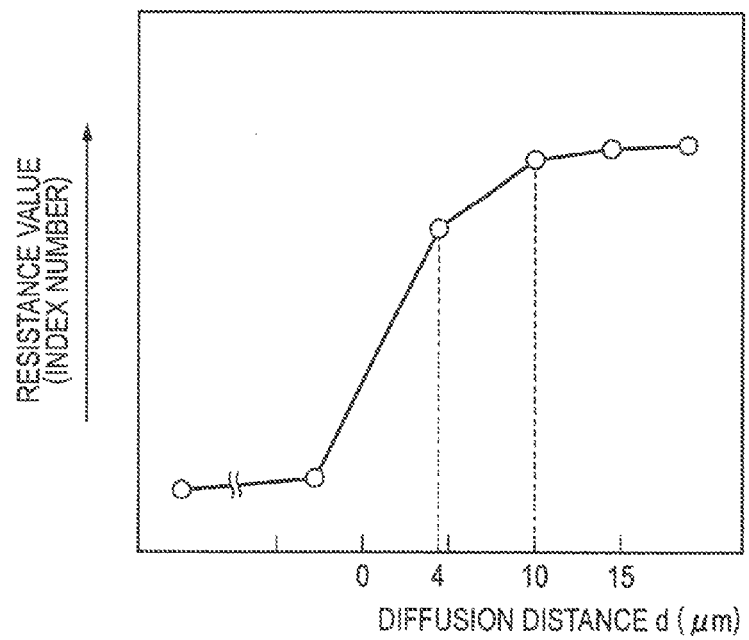
FIGS. 9 (a) and 9(b) are a graph and a view referred to, respectively, in order to describe an example of the diffusion distance of hydrogen when hydrogen is used as a reducing gas.
Figure 9B:
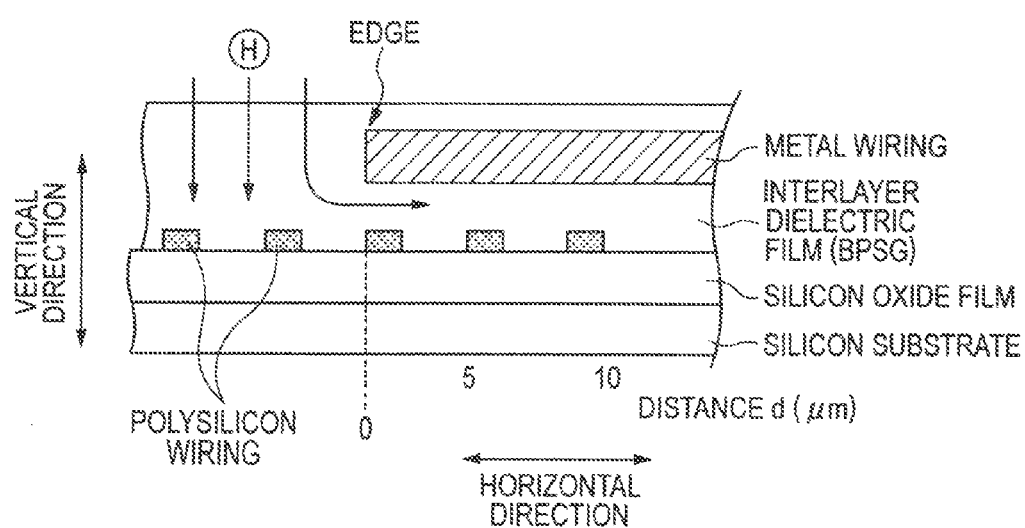

FIGS. 9(a) and 9(b) are a graph and a view referred to, respectively, in order to describe an example of the diffusion distance of hydrogen when hydrogen is used as the reducing gas. In an example shown in FIGS. 9(a) and 9(b), a sample was actually manufactured and then the diffusion distance was calculated.

Specifically, as illustrated in FIG. 9(b), a silicon oxide film was formed on a silicon substrate, and plural polysilicon wiring moieties were formed at regular intervals on the silicon oxide film. An interlayer dielectric film (BPSG film) was formed on the polysilicon and the silicon oxide film, and further a metal wiring made of Al was formed on this interlayer dielectric film. This sample was subjected to hydrogen annealing treatment. The annealing temperature was 450° C., and the annealing period was 20 minutes. After the hydrogen annealing treatment, the resistance value of each of the polysilicon wiring moieties was measured.

FIG. 9(a) is a graph showing a correlation between the distance of each of the polysilicon wiring moieties from an edge of the metal wiring and the resistance value of the polysilicon wiring. In this graph, the position of the edge of the metal wiring is decided to be the original point (0); and further a direction the head of which goes around under the metal wiring is defined as a positive direction along the x axis, and a direction the head of which goes away from the metal wiring, as a negative direction along the x axis.

According to FIG. 9(a), within the range of 10 μm or less from the edge of the metal wiring, the resistance value of the polysilicon wiring was reduced. This reduced value was particularly remarkable within 4 μm of the metal wiring edge. The resistance of the polysilicon wiring is high when hydrogen does not reach the wiring. Accordingly, the arrival distance of hydrogen was 10 μm from the metal wiring edge, and, in particular, within the range of 4 μm or less therefrom, the arrival amount of hydrogen was large. For this reason, the interval between any adjacent two of the openings 316 is preferably 20 μm or less, in particular 8 μm or less.

When the upper end of the gate electrode 120 is positioned at the same level at which the front surface of the semiconductor substrate 100 is positioned, or below the level, the diffusion of the reducing gas from the openings 316 is not easily hindered by the gate electrode 120.

FIG. 10 is a view referred to in order to describe the direction of long sides of the openings 316, and an advantageous effect based on the specified direction. The electrode pad 326 is a terminal from which electric current flowing into the n-type source layer 140 is to be taken out. For example, a bonding wire (not illustrated) is coupled therewith. When the vertical MOS transistor 20 is operated, a drain current flows in the first source wiring 312. The drain current in the first source wiring 312 flows toward a region thereof overlapping with the electrode pad 326 as viewed in plan. Thus, when the long sides of one of the openings 316 are along a straight line for linking the opening 316 with the electrode pad 326, the resistance loss of the drain current in the first source wiring 312 becomes small. When the following angle θ is set to 45° or less, this advantageous effects is produced: the angle made between the long sides of one of the opening 316 and a straight line A showing the direction in which the opening 316 is linked with the electrode pad 326.

Figure 11:
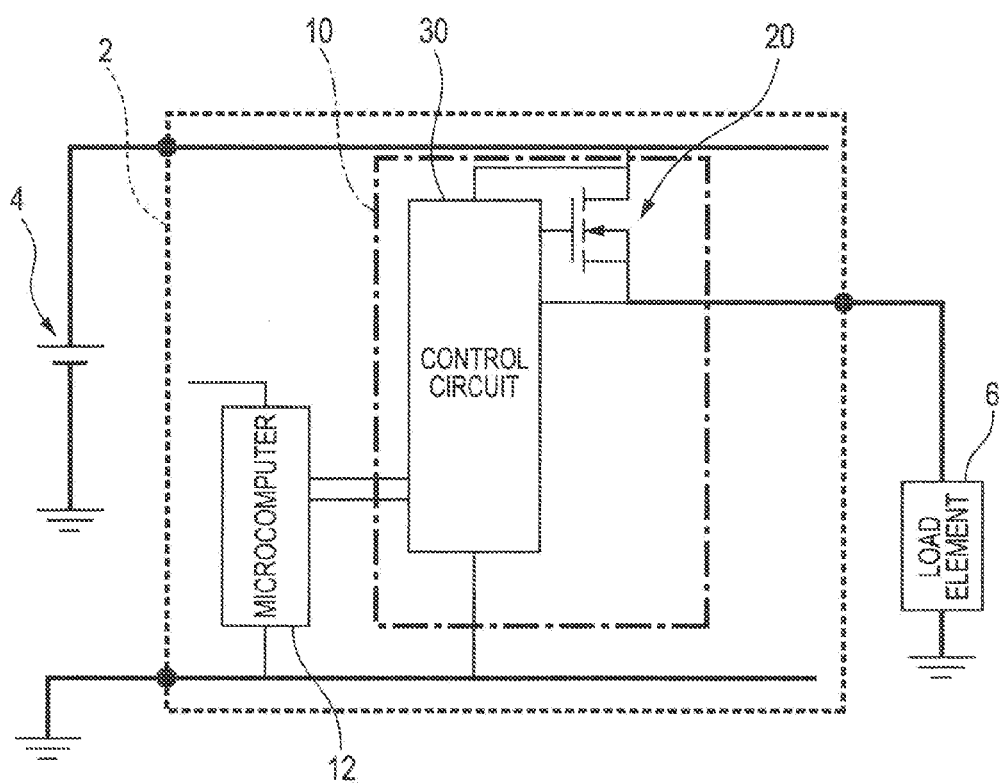
FIG. 11 is a diagram illustrating the structure of a circuit of an electronic device having the semiconductor device.
Figure 31A:
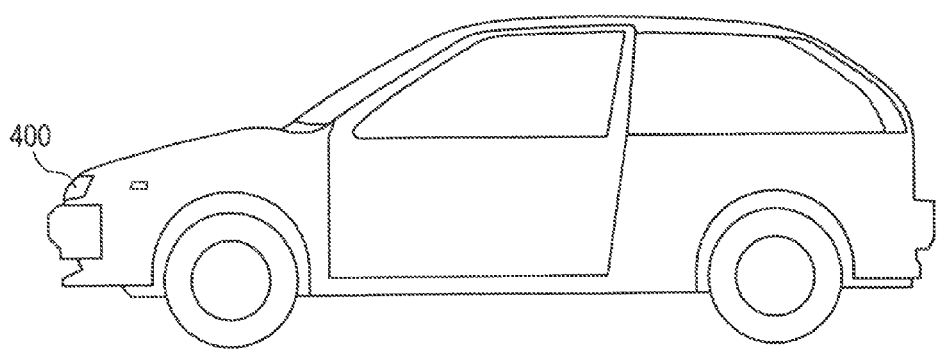
FIGS. 31a and 31B are views referred to in order to describe the usage of the electronic device illustrated in FIG. 11.
Figure 31B:
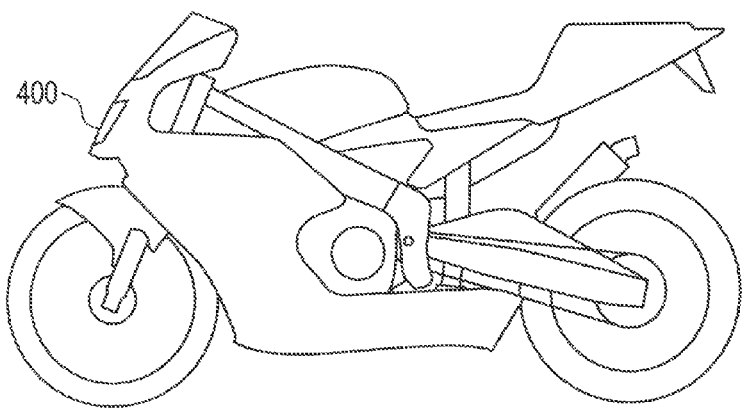

FIG. 11 is a diagram illustrating the structure of a circuit of an electronic device having the semiconductor device 10. This electronic device is used in, for example, a vehicle illustrated in FIG. 31, and has an electronic device 2, a power source 4, and a load 6. The power source 4 is, for example, a battery mounted in the vehicle. The load 6 is, for example, an electronic component mounted in the vehicle, for example, a head lamp 400 illustrated in FIG. 31. The electronic device 2 controls an electric power supplied from the power source 4 to the load 6.

The electronic device 2 is a device in which a semiconductor device 10 (equivalent to the above-mentioned device 10), and a semiconductor device 12 are mounted on a circuit substrate (for example, a printed wiring board). In the example illustrated in this figure, the semiconductor device 10 is an IPD (intelligent power device). The semiconductor device 12 is a microcomputer, and is coupled through a wiring of the circuit substrate with the semiconductor device 10. The semiconductor device 12 controls the semiconductor device 10. Specifically, the semiconductor device 12 inputs a control signal to a control circuit 30. In accordance with the control signal inputted from the semiconductor device 12, the control circuit 30 inputs a signal to a gate electrode 120 of a vertical MOS transistor 20 of the device 10. In short, the control circuit 30 controls the vertical MOS transistor 20. When the vertical MOS transistor 20 is controlled, an electric power from the power source 4 is appropriately supplied to the load 6.

FIG. 12 is a plan view of the semiconductor device 10 illustrated in FIG. 11. As illustrated in FIG. 12, the semiconductor device 10 has a region where the vertical MOS transistor 20 is formed, and a region where the control circuit 30 is formed. Electrode pads 40 coupled with the control circuit 30 are formed on the front surface of the semiconductor device 10. At least one of the electrode pads 40 may be positioned at a region opposite to the region where the control circuit 30 is formed across the region where the vertical MOS transistor 20 is formed.

Figure 13A:
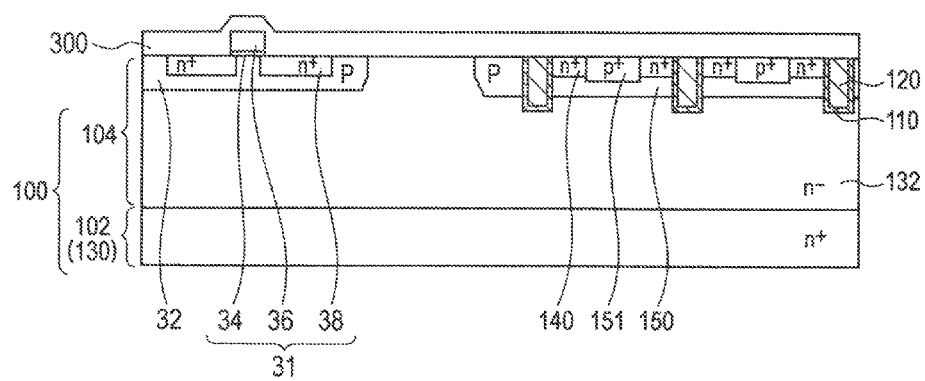
FIGS. 13(a) and 13(b) are each a sectional view illustrating a method of manufacturing the semiconductor device illustrated in FIG. 1.
Figure 13B:
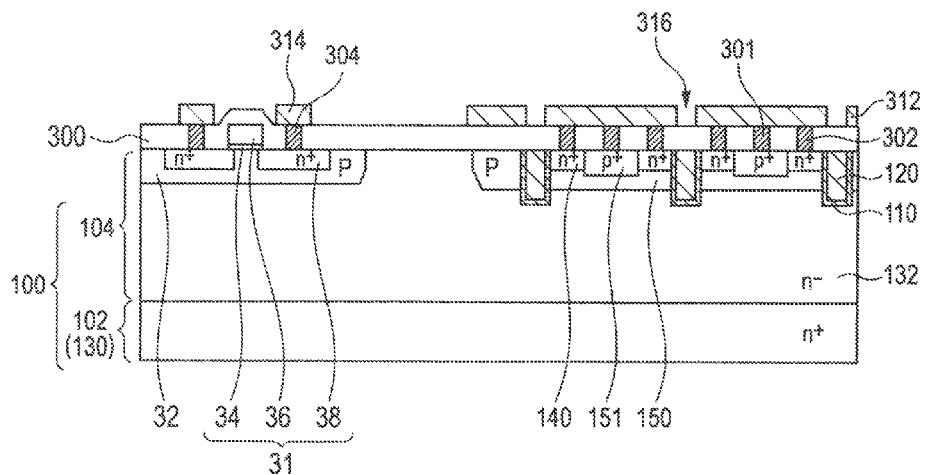
Figure 14A:
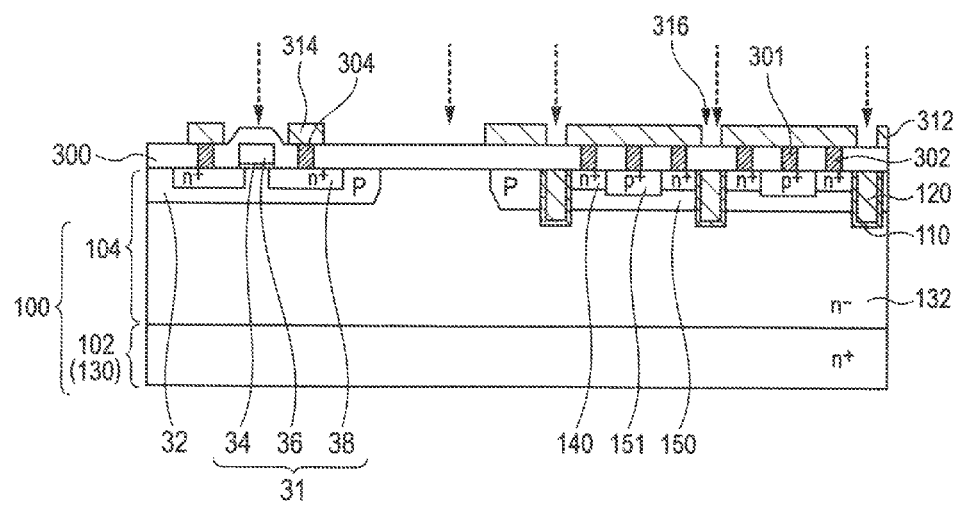
FIGS. 14(a) and 14(b) are each a sectional view illustrating the method of manufacturing the semiconductor device illustrated in FIG. 1.
Figure 14B:
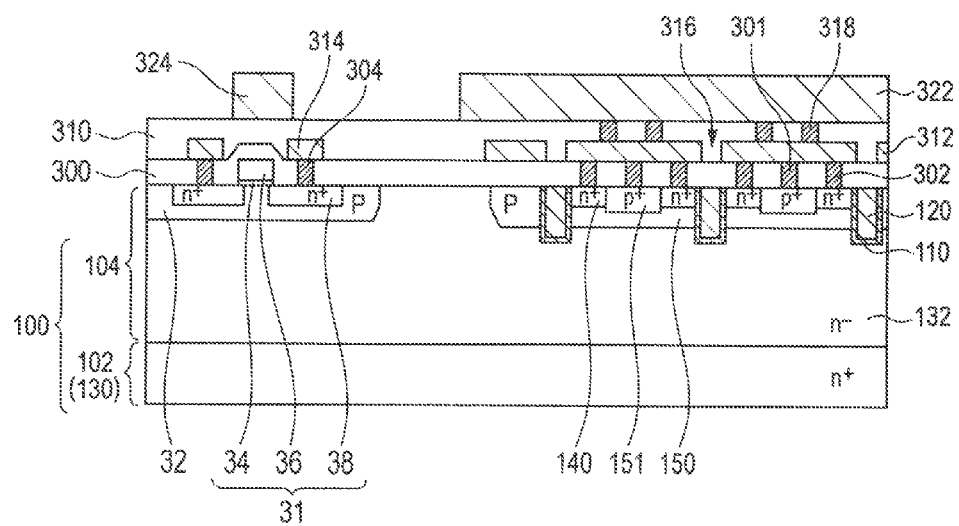
Figure 15:
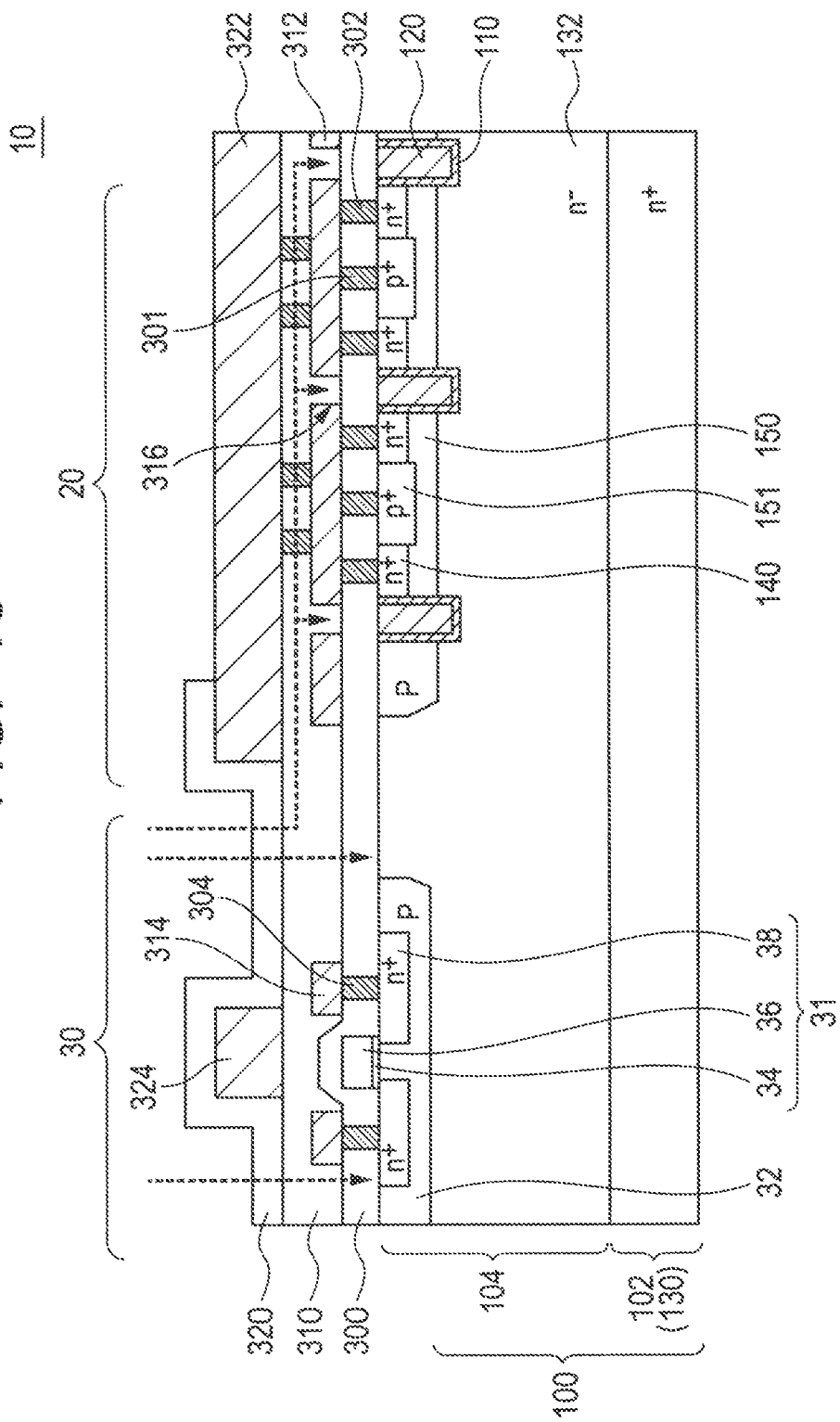
FIG. 15 is a sectional view illustrating the method of manufacturing the semiconductor device illustrated in FIG. 1.

FIG. 13 to FIG. 15 are sectional views illustrating a method of manufacturing a semiconductor device 10 as illustrated in FIG. 1. As illustrated in FIG. 13($a$), prepared is first an $n^+$-type sub-substrate 102. Next, an $n^-$-type epitaxial layer 104 is formed on the sub-substrate 102. Next, an element isolation film is formed on the front surface of the epitaxial layer 104. Next, a depression in which a gate electrode 120 is to be buried is made in the semiconductor substrate 100 concerned.

Next, the semiconductor substrate 100 is thermally oxidized. In this way, a gate insulator film 110 is formed on the inner wall and the bottom surface of the depression. This thermally oxidized film is formed also in the region of the semiconductor substrate 100 front surface which is a region not covered with the element isolation film. Next, a polysilicon film is formed on the inside of the depression, and the semiconductor substrate 100 by, for example, CVD. Next, the polysilicon film positioned on the semiconductor substrate 100 is removed by, for example, etching-back. In this way, a gate electrode, as the gate electrode 120 described in the just above paragraph, is buried in the depression. At this time, a gate wiring 122 is also formed.

Next, a p-type impurity is ion-implanted into the epitaxial layer 104 of the semiconductor substrate 100. In this way, a p-type base layer 150 is formed shallowly than the gate electrode 120. Thereafter, an n-type impurity is ion-implanted into the p-type base layer 150 to form an n-type source layer 140. Furthermore, a p-type impurity is ion-implanted into the p-type base layer 150 to form a p-type layer 151.

Additionally, a well 32, a gate insulator film 34, a gate electrode 36, and an impurity region 38 are formed in the semiconductor substrate 100 to form a planar MOS transistor 31. At least one part of the process for forming the MOS transistor 31 may be identical with a part of the process for forming the vertical MOS transistor 20 concerned. For example, the step of forming the n-type source layer 140 or the step of forming the p-type layer 151 may be identical with the step of forming the impurity region 38. The step of forming the gate electrode 36 may be identical with the step of forming the gate electrode 120. Next, a first interlayer dielectric film 300 is formed on the semiconductor substrate 100 by, for example, CVD.

Next, as illustrated in FIG. 13($b$), a resist pattern (not illustrated) is formed on the first interlayer dielectric film 300. This resist pattern is used as a mask to etch the first interlayer dielectric film 300, thereby making, in the first interlayer dielectric film 300, coupling holes in which contacts 301, 302 and 304 are to be buried. Thereafter, the resist pattern is removed. Next, a W film is formed inside these coupling holes and on the first interlayer dielectric film 300 by CVD. Portions of this W film that are positioned on the first interlayer dielectric film 300 are removed to make the contacts 301, 302 and 304.

Next, an Al film is formed inside the coupling holes and on the first interlayer dielectric film 300 by sputtering. Next, a resist pattern (not illustrated) is formed on the Al film. This resist pattern is used as a mask to etch the Al film, thereby forming a first source wiring 312 and a wiring 314. In this step, openings 316 are made in the first source wiring 312. Thereafter, the resist pattern is removed.

Next, as illustrated in FIG. 14($a$), the semiconductor substrate 100 is subjected to annealing treatment in the atmosphere of a reducing gas, for example, hydrogen (first reducing treatment). In this step, the reducing gas reaches, through the openings 312 in the first source wiring 312, the region of the semiconductor substrate 100 that is a region positioned below the first source wiring 312. Thus, the whole of the region of the semiconductor substrate 100 that is a region positioned below the first source wiring 312 is also treated with the reducing gas.

Next, as illustrated in FIG. 14($b$), a second interlayer dielectric film 310 is formed on the first interlayer dielectric film 300 by, for example, CVD. Next, a resist pattern (not illustrated) is formed on the second interlayer dielectric film 310. This resist pattern is used as a mask to etch the second interlayer dielectric film 310, thereby making, in the second interlayer dielectric film 310, coupling holes where vias 318 are to be buried. Thereafter, the resist pattern is removed. Next, a W film is formed inside these coupling holes and on the second interlayer dielectric film 310 by CVD. The region of this W film that is a region positioned on the second interlayer dielectric film 310 is removed to make vias as the vias 318 described just above.

Next, an Al film is formed on the second interlayer dielectric film 310 by sputtering. Next, a resist pattern (not illustrated) is formed on the Al film. This resist pattern is used as a mask to etch the Al film, thereby forming a second source wiring 322 and a logic wiring 324. Thereafter, the resist pattern is removed.

Next, as illustrated in FIG. 15, the semiconductor substrate 100 is subjected to annealing treatment in the atmosphere of a reducing gas, for example, hydrogen (second reducing treatment). By this treatment, the MOS transistor 31 of the control circuit 30 is treated with the reducing gas.

Thereafter, a protective insulator film 320 is formed on the second interlayer dielectric film 310, the second source wiring 322, and the logic wiring 324. Next, the protective insulator film 320 is selectively removed. Furthermore, a drain electrode 202 is formed on the rear surface of the semiconductor substrate 100. In this way, the semiconductor device 10 illustrated in FIG. 1 is formed.

It is conceivable that the reducing treatment is conducted before the formation of the first source wiring 312, that is, when the state illustrated in FIG. 13(a) is kept. In this case, however, the reducing gas (such as hydrogen) remains in an excessive amount in the gate electrode 120 or the first interlayer dielectric film. 300 so that the vertical MOS transistor 20 may be deteriorated in hot carrier resistance. In other words, the first source wiring 312 and the openings 316 function also as a filter for controlling the supply amount of the reducing gas into an appropriate value.

Figure 16:
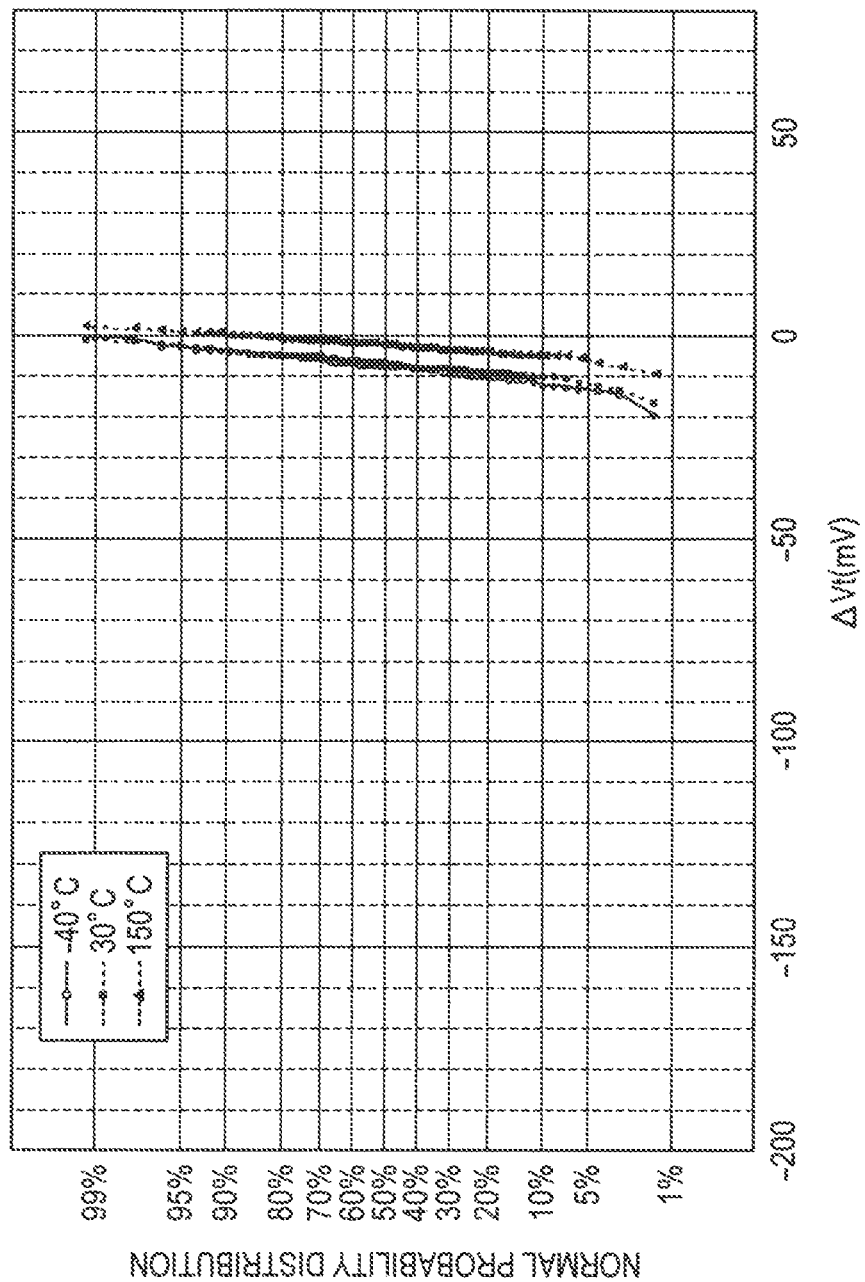
FIG. 16 is a graph referred to in order to describe advantageous effects of the first embodiment.
Figure 17:
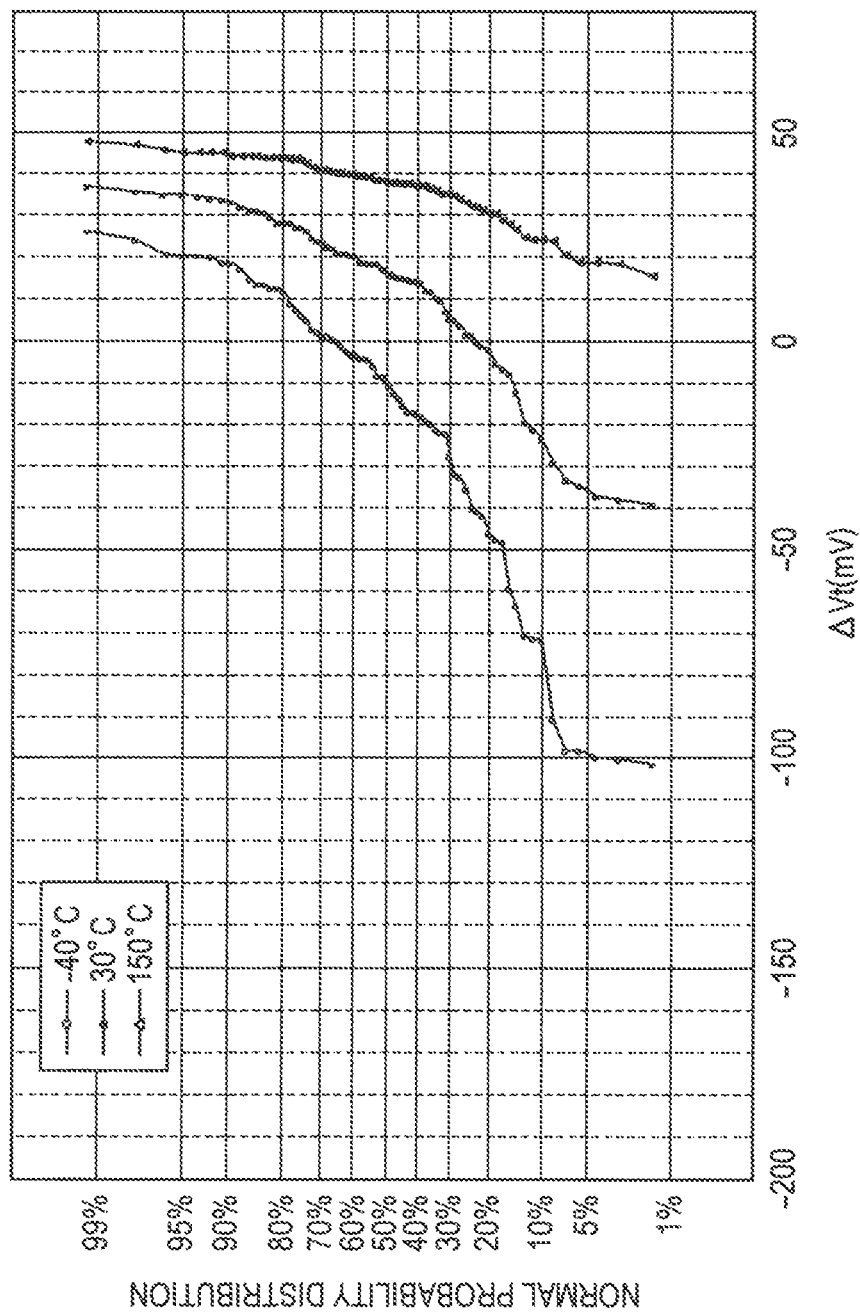
FIG. 17 is another graph referred to in order to describe the advantageous effects of the first embodiment.

FIGS. 16 and 17 are each a graph referred to in order to describe advantageous effects of the present embodiment. FIGS. 16 and 17 each show a normal probability distribution of a difference in threshold voltage (ΔVt) between the vertical MOS transistor 20 and the sensing vertical transistor 21 (see FIG. 2). FIG. 16 shows results obtained by measuring the semiconductor device 10 having the structure illustrated in FIG. 1, and FIG. 17 shows results obtained by measuring a semiconductor device 10 having the same structure as illustrated in FIG. 1 except that the openings 316 are not made.

As illustrated in FIG. 17, when the openings 316 were not made in the first source wiring 312, the difference in threshold voltage was large between the vertical MOS transistor 20 and the sensing vertical transistor 21. Moreover, the difference was largely varied or scattered. Furthermore, high was the temperature-dependency of the difference in threshold voltage between the vertical MOS transistor 20 and the sensing vertical transistor 21.

On the other hand, as illustrated in FIG. 16, when the openings 316 were made in the first source wiring 312, the difference in threshold voltage was small between the vertical MOS transistor 20 and the sensing vertical transistor 21. Moreover, the difference was hardly varied or scattered. Furthermore, low was the temperature-dependency of the difference in threshold voltage between the vertical MOS transistor 20 and the sensing vertical transistor 21.

As described above, according to the present embodiment, properties of the vertical MOS transistor 20 can be restrained from being varied from those of the same other transistors.

Second Embodiment

Figure 18:
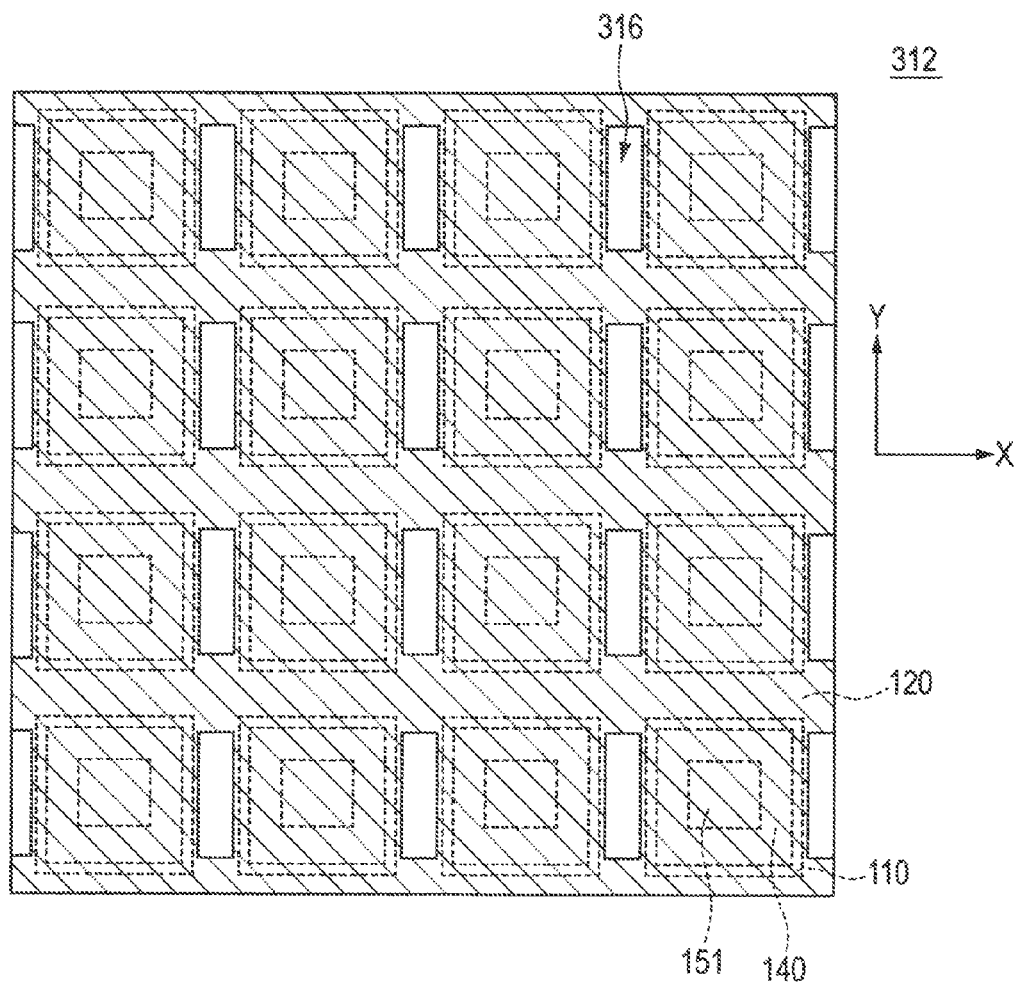
FIG. 18 is a view illustrating the structure of a first source wiring in a semiconductor device according to a second embodiment of the invention.

FIG. 18 is a view illustrating the structure of a first source wiring 312 in a semiconductor device 10 according to a second embodiment of the invention. This figure corresponds to FIG. 7, which has illustrated the first embodiment. The semiconductor device according to the present embodiment has the same structure as the first embodiment except the layout of openings 316.

In the semiconductor device 10 according to the embodiment, the openings 316 are arranged into a lattice form. Specifically, when the device is viewed along the x direction in FIG. 18, each of the openings 316 is arranged at any one out of regions between n-type source layers 140.

The embodiment can also produce the same advantageous effects as the first embodiment. Moreover, the arrangement density of the openings 316 is higher than that of the first embodiment, so that properties of a vertical MOS transistor 20 of the present device 10 can be further restrained from being varied from those of the same other transistors.

Third Embodiment

Figure 19:
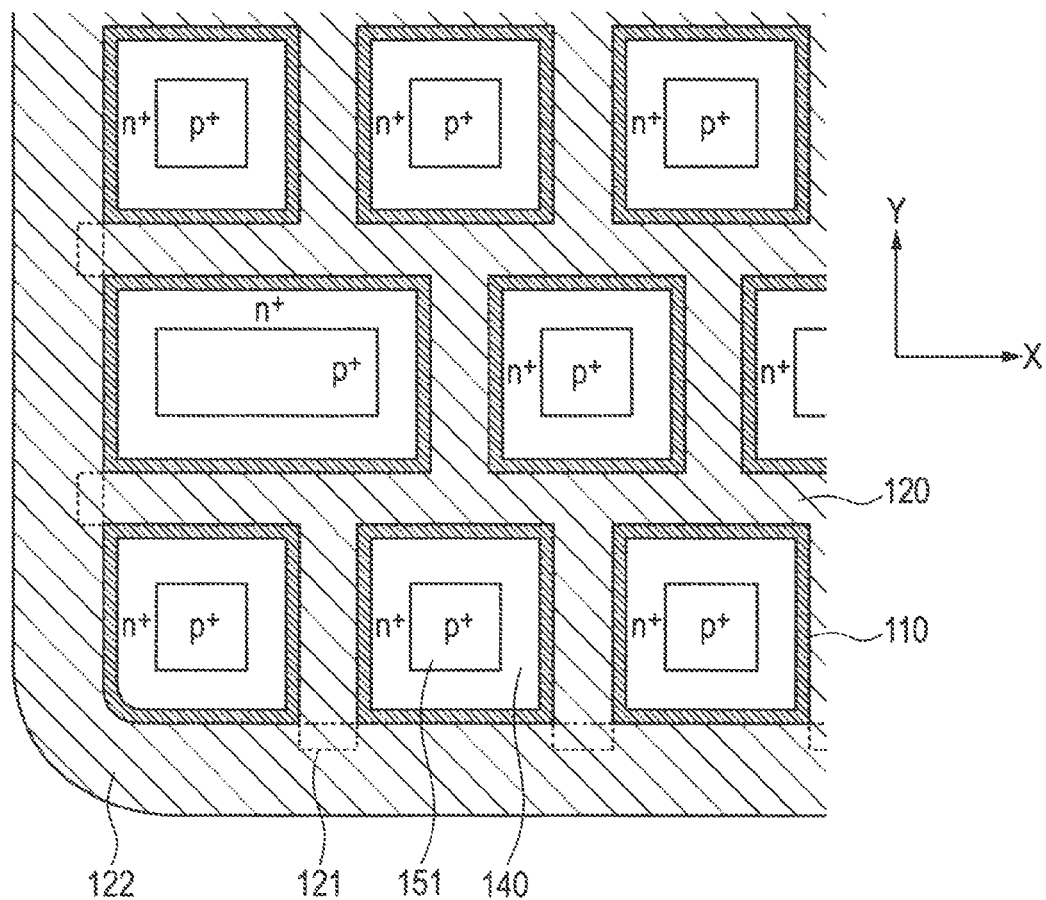
FIG. 19 is a view illustrating the layout of an n-type source layer and a gate electrode according to a third embodiment of the invention.

FIG. 19 is a view illustrating the layout of an n-type source layer 140 and a gate electrode 120 in a semiconductor device 10 according to a third embodiment of the invention. This figure corresponds to FIG. 4, which has illustrated the first embodiment. In the present embodiment, the semiconductor device 10 has the same structure as the semiconductor device 10 according to the first embodiment except the layout of the gate electrode 120, the n-type source layer 140, and openings 316.

In the embodiment, the n-type source layer 140 is arranged into a cross-woven lattice form. Following this arrangement, moieties of the gate electrode 120 that are extended along the y direction in FIG. 19 and on respective rows are zigzaggedly arranged.

Figure 20:
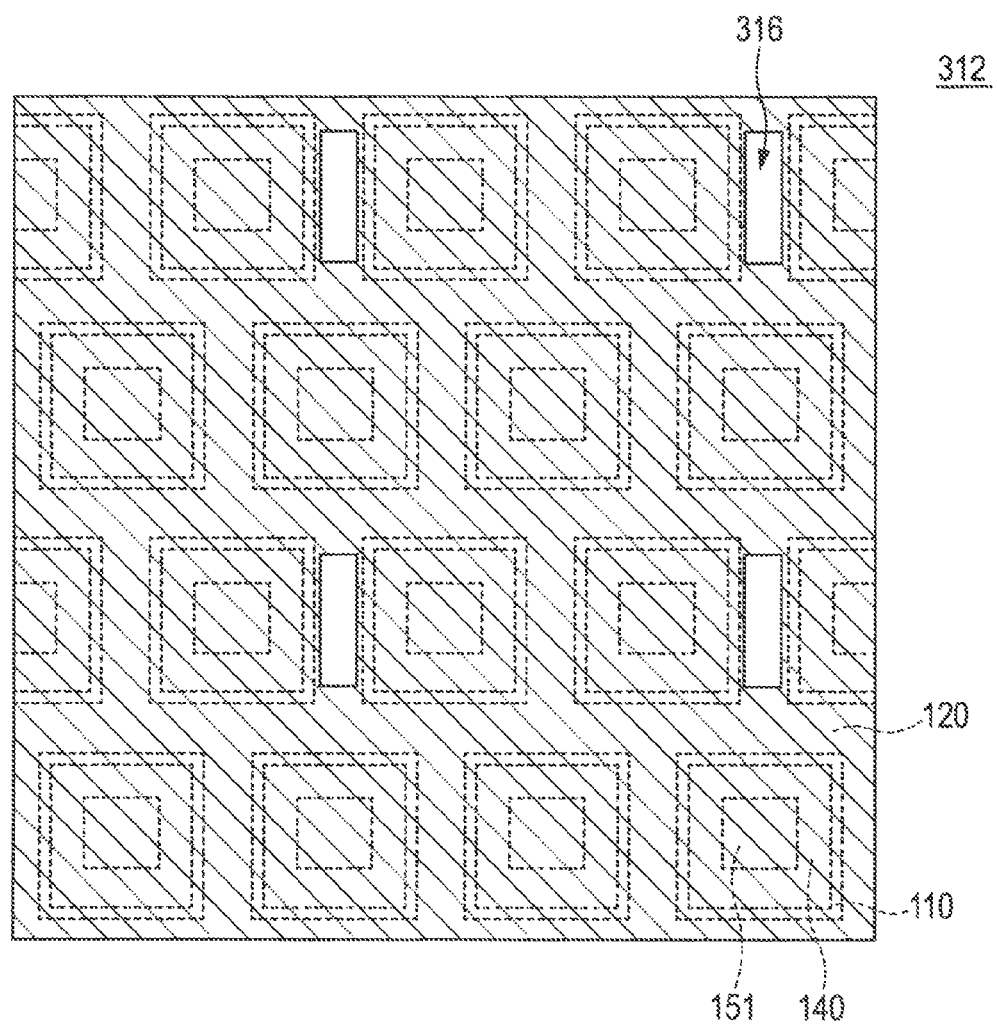
FIG. 20 is a view illustrating a planar form of a first source wiring in the third embodiment.

FIG. 20 is a view illustrating a planar form of a first wiring 312 in the embodiment. This figure corresponds to FIG. 7, which has illustrated the first embodiment. In the present embodiment also, the arrangement density of the openings 316 is determined on the basis of the diffusion distance of a reducing gas used when the workpiece of the present device is annealed. In the example illustrated in the present figure, the openings 316 are arranged every other row and every third column in a matrix which the gate electrode 120 forms.

The embodiment can also produce the same embodiment as the first embodiment.

Fourth Embodiment

Figure 21:
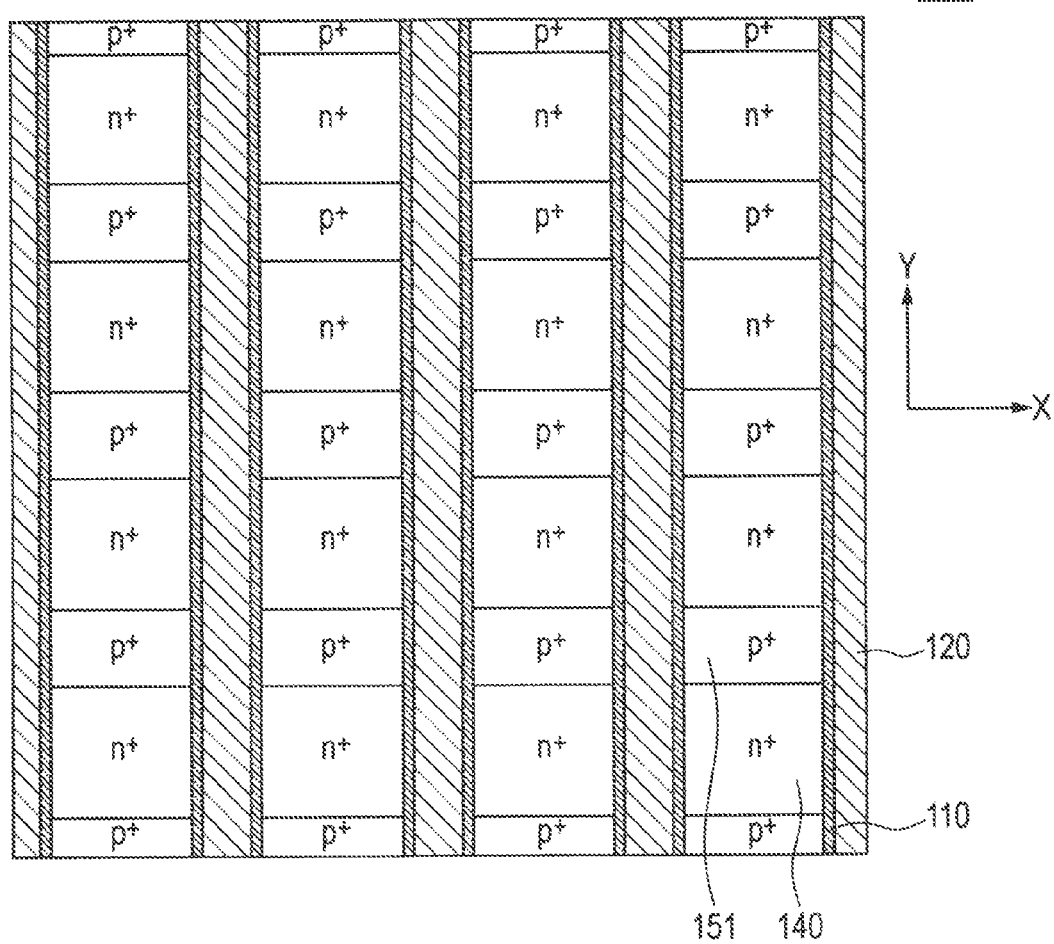
FIG. 21 is a view illustrating the layout of an n-type source layer, a p-type layer and a gate electrode according to a fourth embodiment of the invention.

FIG. 21 is a view illustrating the layout of an n-type source layer 140, a p-type layer 151 and gate electrodes 120 in a semiconductor device 10 according to a fourth embodiment of the invention. This figure corresponds to FIG. 4, which has illustrated the first embodiment. The semiconductor device 10 according to the present embodiment has the same structure as the semiconductor device 10 according to the first embodiment except the layout of the n-type source layer 140, the p-type layer 151, the gate electrodes 120 and openings 316.

In the embodiment, the gate electrodes 120, the number of which is two or more, are extended in parallel to each other. In regions of a semiconductor substrate 100 that are positioned between the gate electrodes 120, the n-type source layer 140 and the p-type layer 151 are formed. When the embodiment is viewed along the direction in which the gate electrodes 120 are extended, the n-type source layers 140 are arranged to be alternated with the p-type layers 151. In the embodiment illustrated in this figure, the n-type source layers 140 are each larger in area than each of the p-type layers 151. The n-type source layer 140 which is positioned at a first column and the n-type source layer 140 which is positioned at a column adjacent to the first column are positioned at the same position when attention is paid only to the direction in which the gate electrodes 120 are extended. In other words, in the y direction in this figure, the individual rows made of the n-type source layers 140 are arranged to be alternated with the individual rows made of the p-type layers 151.

Figure 22:
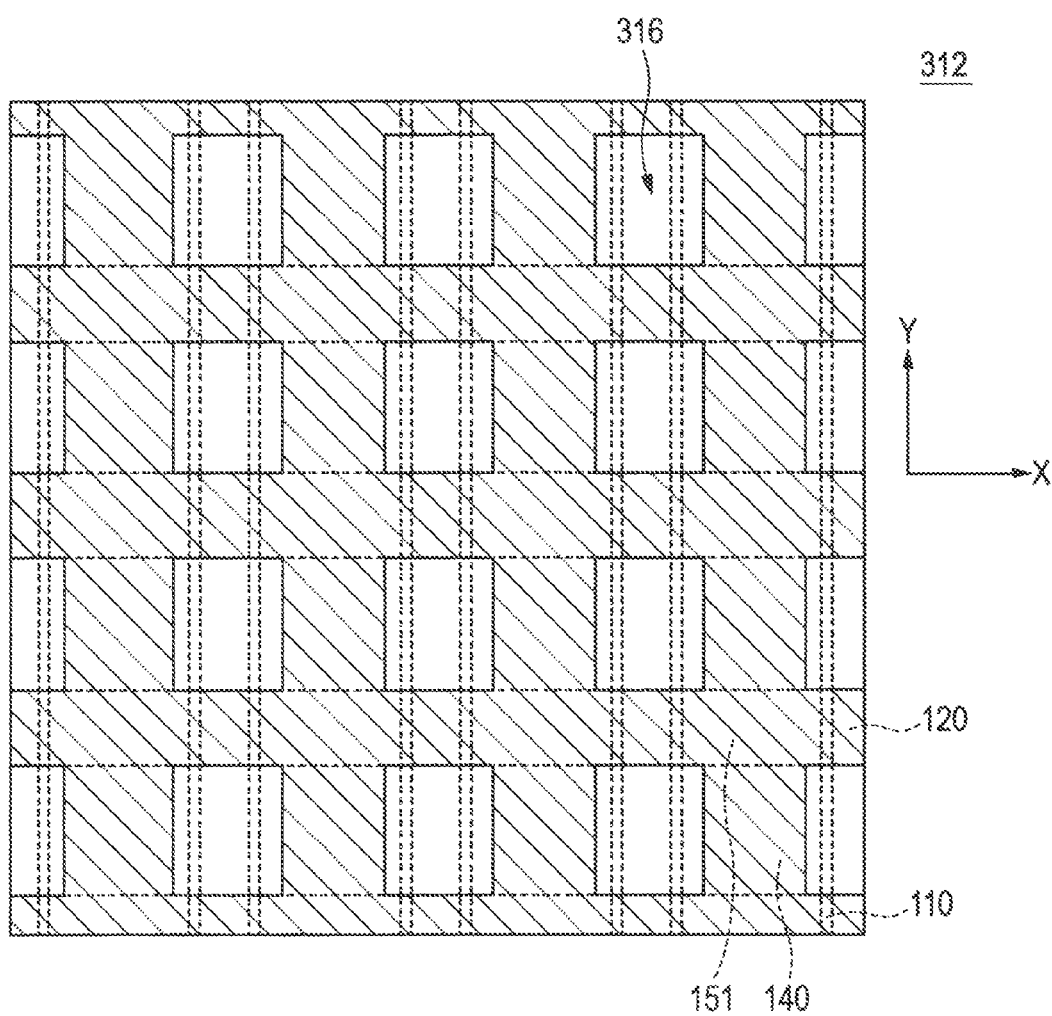
FIG. 22 is a view illustrating a planar form of a first source wiring according to the fourth embodiment.

FIG. 22 is a view illustrating a planar form of a first source wiring 312 in the embodiment. This figure corresponds to FIG. 7, which has illustrated the first embodiment. In the present embodiment, the openings 316 are arranged in the rows made of the n-type source wiring layer 140. Each of the openings 316 is arranged over any one out of gaps between the adjacent n-type source layers 140. When the openings 316 are viewed in plan, each of the openings 316 is overlapped with any one of the gate electrodes 120; however, both end regions of the opening 316 are protruded out from the gate electrode 120. Protruded portions of the opening 316 from the gate electrode 120 are overlapped with the n-type source layer 140; however, at least one region of the protruded portions of the opening 316 from the gate electrode 120 may be overlapped with the p-type layer 151.

The embodiment can also produce the same advantageous effects as the first embodiment. Moreover, the openings 316 can be made large, so that the reducing gas (concerned) can be more easily diffused toward below the first source wiring 312. As a result, properties of a vertical MOS transistor 20 of the present device 10 can be further restrained from being varied from those of the same other transistors.

Fifth Embodiment

Figure 23:
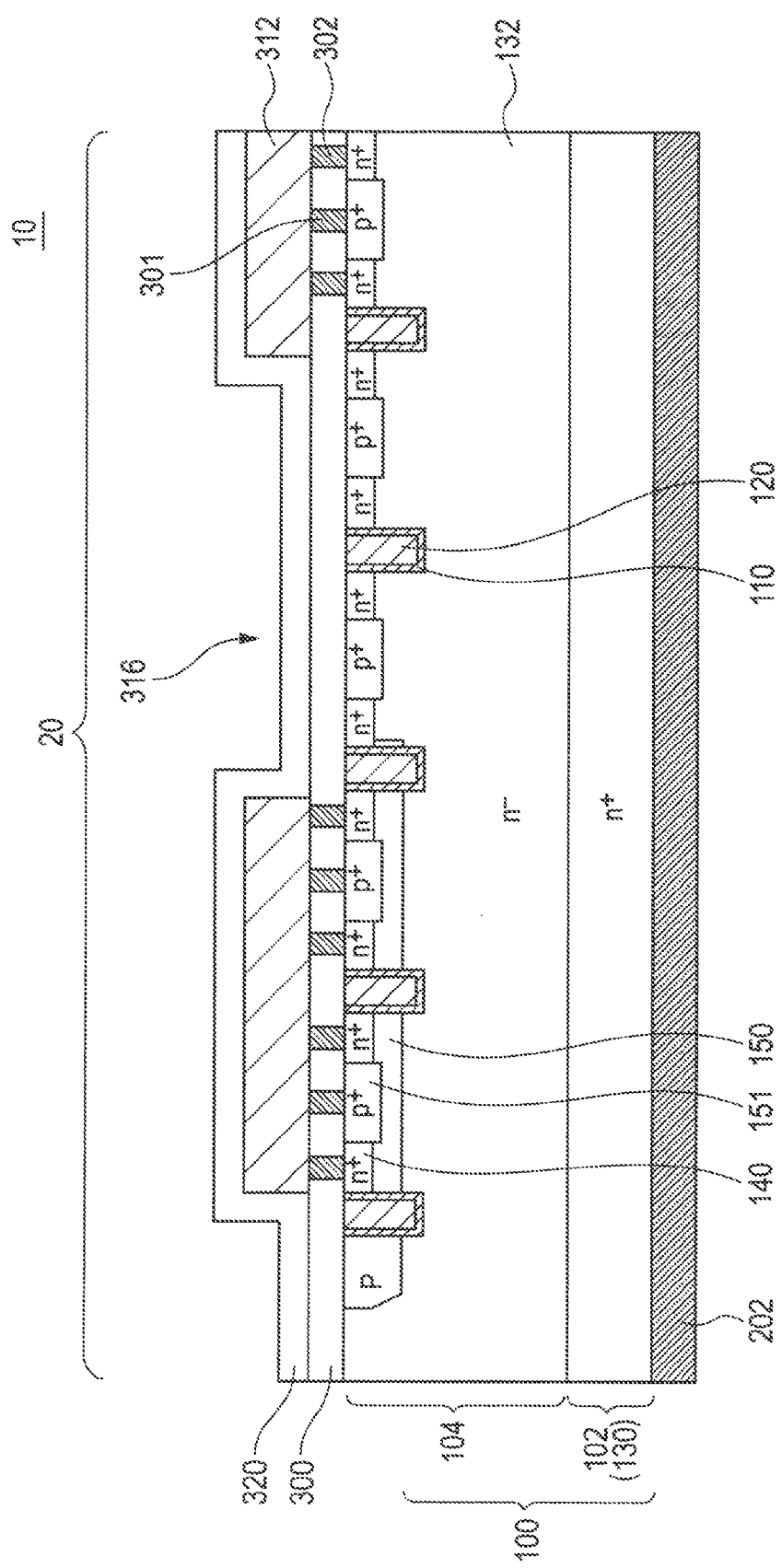
FIG. 23 is a view illustrating the structure of a semiconductor device according to a fifth embodiment of the invention.

FIG. 23 is a view illustrating the structure of a semiconductor device 10 according to a fifth embodiment of the invention. This figure corresponds to FIG. 1, which has illustrated the first embodiment. However, FIG. 23 illustrates only a vertical MOS transistor 20 thereof without illustrating a control circuit 30 thereof. The semiconductor device 10 according to the present embodiment has the same structure as the semiconductor device according to any one of the first to fourth embodiments except the following matters:

First, the semiconductor device 10 has neither any second interlayer dielectric film 310 nor any second source wiring 322. In short, the semiconductor device 10 has only one wiring layer. On a first interlayer dielectric film 300 and a first source wiring 312 is formed a protective insulator film 320. The first source wiring 312 is partially configured as an electrode pad 326 as illustrated in FIG. 10. At this time, the thickness of the first wiring is a value of 2.0 to 6.0 μm inclusive, which is equivalent to that of each of a second source wiring 322 and a logic wiring 324.

Figure 24:
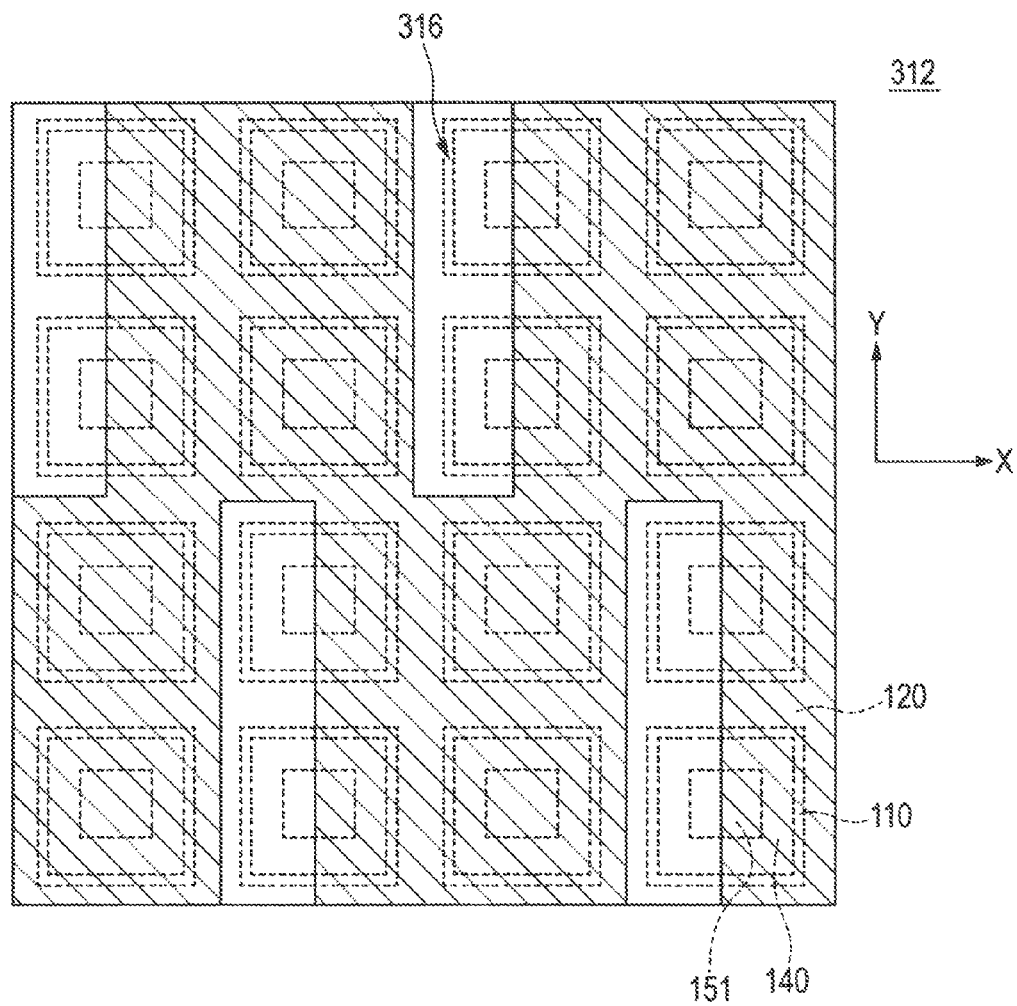
FIG. 24 is a view illustrating the layout of a first source wiring in the semiconductor device illustrated in FIG. 23.

FIG. 24 is a view illustrating the layout of the first source wiring 312 in the semiconductor device 10 illustrated in FIG. 23. As illustrated in this figure and FIG. 23, openings 316 are partially positioned over both of an n-type source layer 140 and a p-type layer 151. Specifically, the width of each of the openings 316 in the y direction in FIG. 24 is larger than the arrangement interval between moieties of a gate electrode 120, and is, for example, two times the interval. However, the width of each of the openings 316 in the x direction in FIG. 24 is narrower than the arrangement interval between the moieties of the gate electrode 120, and is, for example, ½ thereof. In the n-type source layer 140 and the p-type layer 151 partially overlapped with the openings 316, contacts 301 and 302 are made in their regions that are not overlapped with the openings 136 as the layers 140 and 151 are viewed in plan.

According to the embodiment, the advantageous effects described about the first embodiment can be gained even when the semiconductor device 10 has only one wiring layer.

Sixth Embodiment

Figure 25:
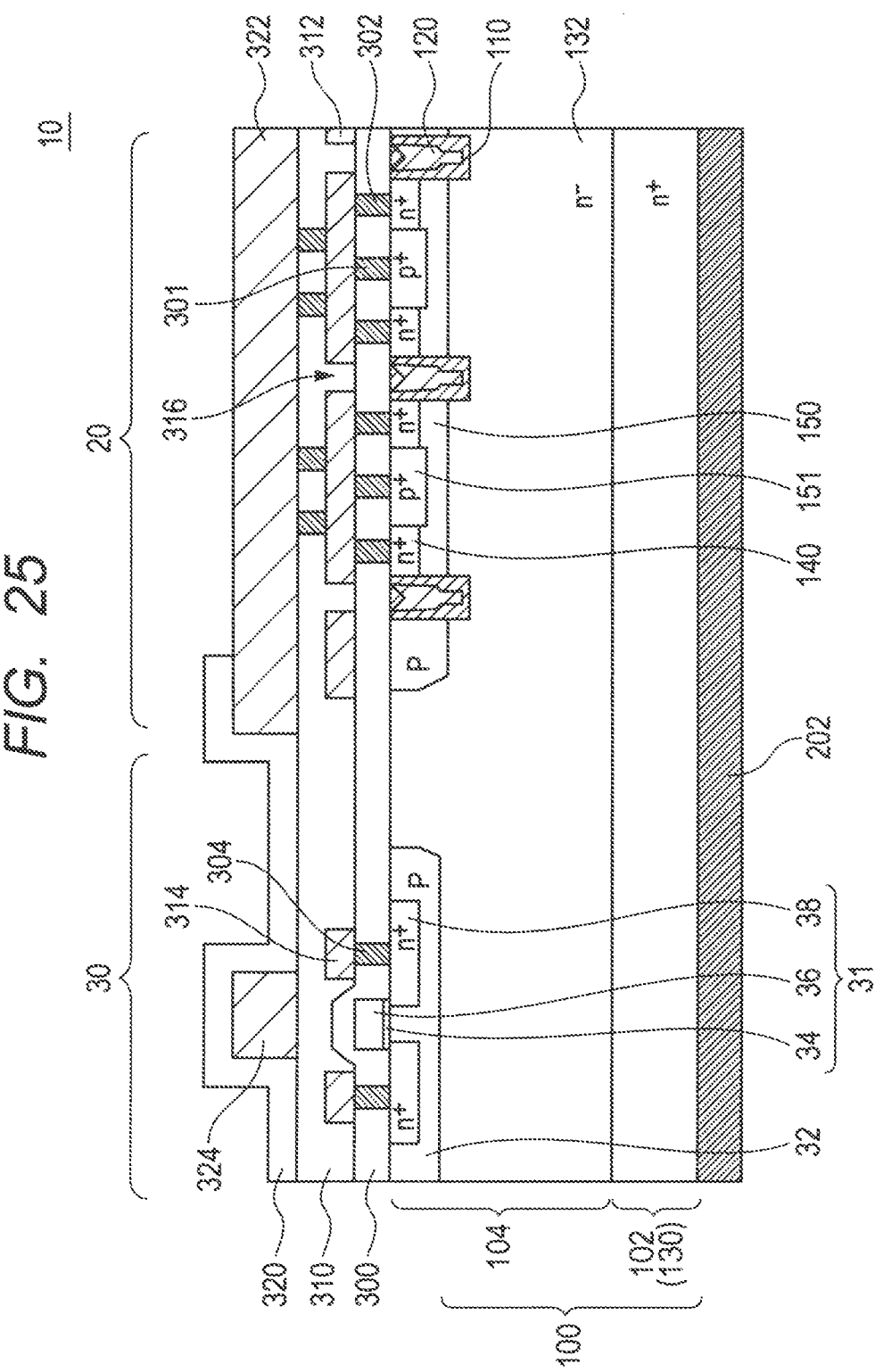
FIG. 25 is a view illustrating the structure of a semiconductor device according to a sixth embodiment of the invention.

FIG. 25 is a view illustrating the structure of a semiconductor device 10 according to a sixth embodiment of the invention. The semiconductor device 10 according to the embodiment has the same structure as the semiconductor device 10 according to any one of the first to fifth embodiments except that a gate insulator film 110 positioned on the bottom of a depression in a semiconductor substrate 100 is thicker than a gate insulator film 110 positioned over the depression. In the embodiment, the gate insulator film 110 positioned on the bottom of the depression in the semiconductor substrate 100, and the gate insulator film 110 positioned over the depression are formed in steps different from each other. The embodiment can produce the same advantageous effects as any one of the first to fifth embodiments.

Seventh Embodiment

Figure 26:
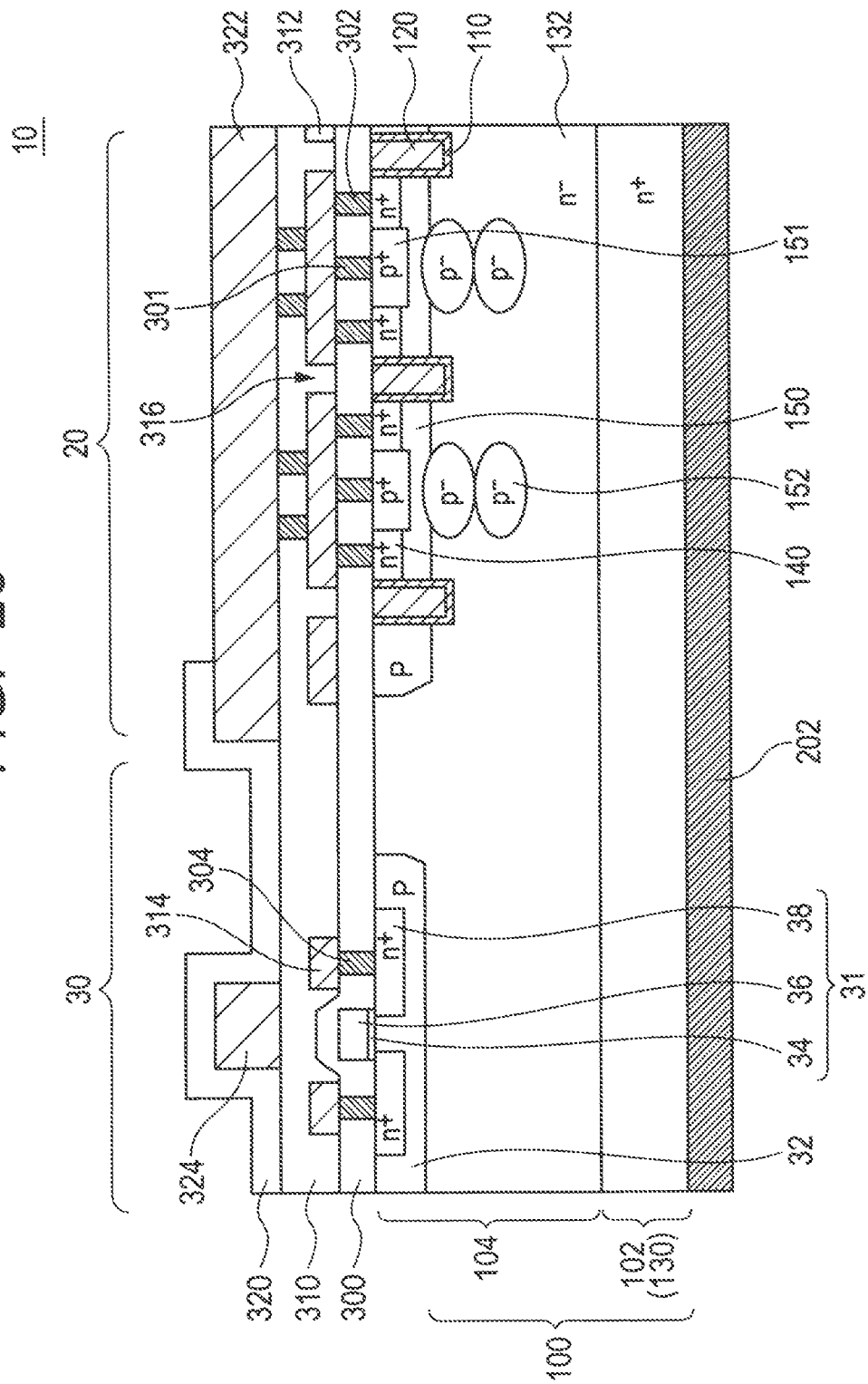
FIG. 26 is a view illustrating the structure of a semiconductor device according to a seventh embodiment of the invention.

FIG. 26 is a view illustrating the structure of a semiconductor device according to a seventh embodiment of the invention. The semiconductor device 10 according to the embodiment has the same structure as the semiconductor device 10 according to any one of the first to sixth embodiments except that the former device 10 has a p-type buried layer 152.

Specifically, in the embodiment, a portion of a semiconductor substrate 100 where a vertical MOS transistor 20 is formed has a region that has neither any n-type source layer 140 nor p-type layer 151 formed as a surface layer of the region. Below this region, the p-type buried layer 152 is formed. When the device 10 is viewed in the depth direction, the p-type buried layer 152 is positioned below a p-type base layer 150 and coupled with the p-type base layer 150.

The embodiment can also produce the same advantageous effects as the first embodiment. Moreover, the p-type buried layer 152 makes it possible to produce an advantageous effect of improving the semiconductor device in pressure resistance.

Eighth Embodiment

Figure 27:
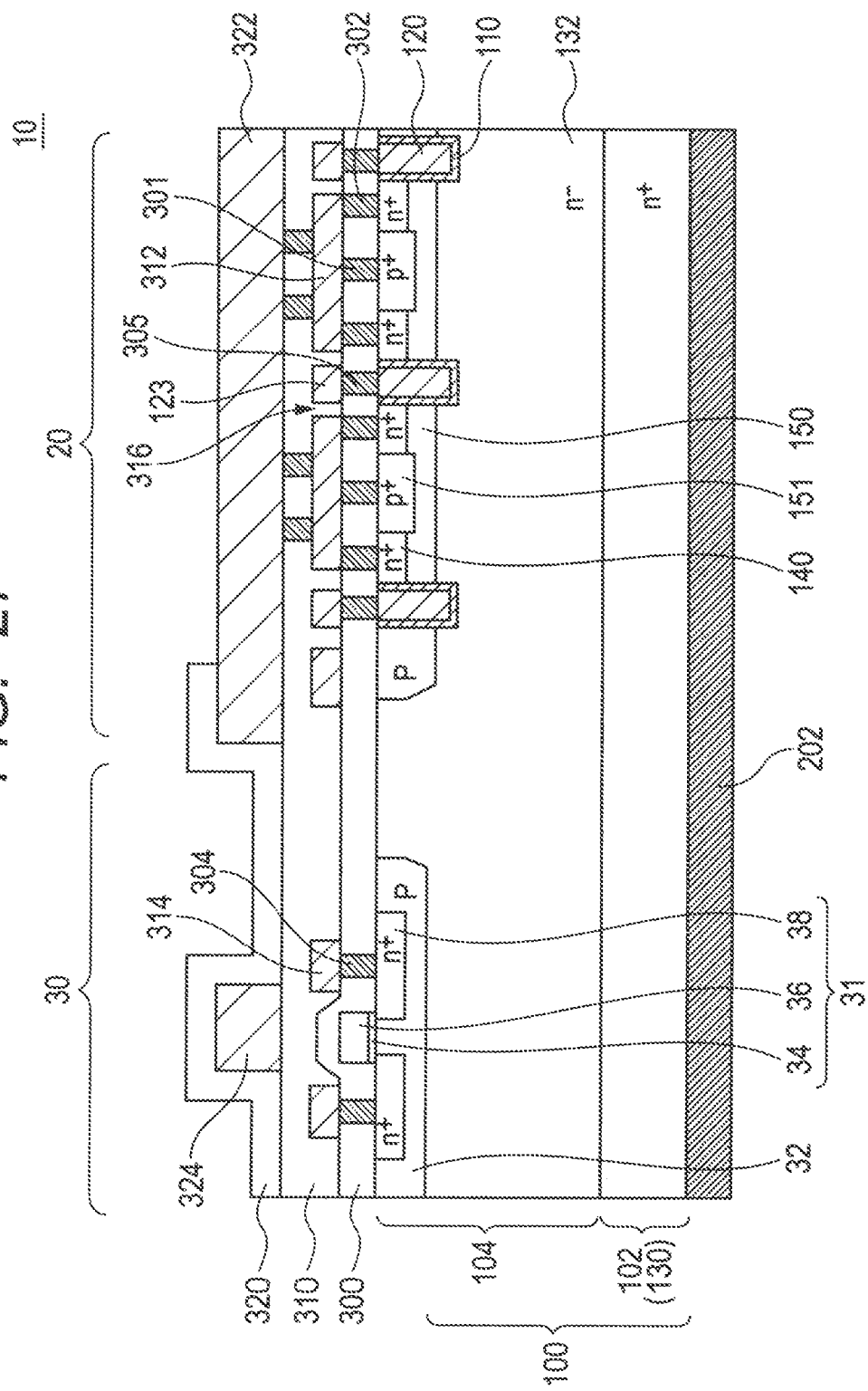
FIG. 27 is a view illustrating the structure of a semiconductor device according to an eighth embodiment of the invention.
Figure 28:
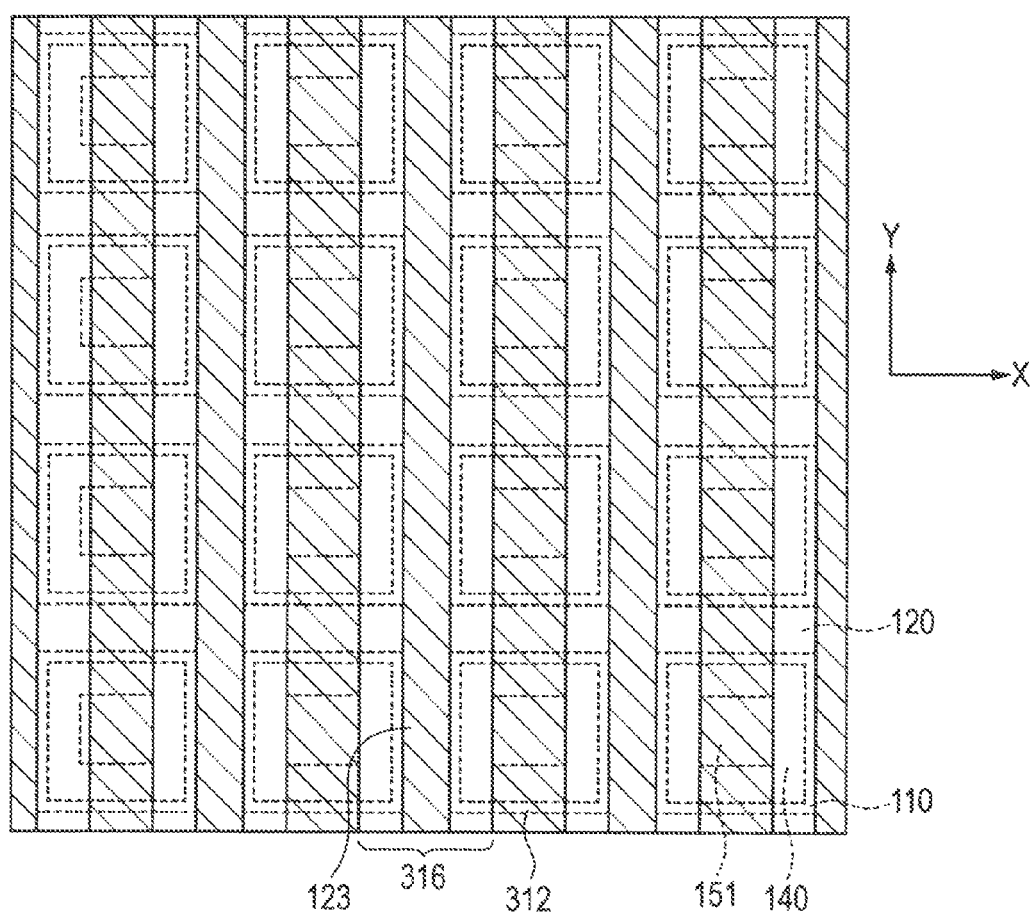
FIG. 28 is a view illustrating a first example of the layout of a first source wiring in the semiconductor device illustrated in FIG. 27.
Figure 29:
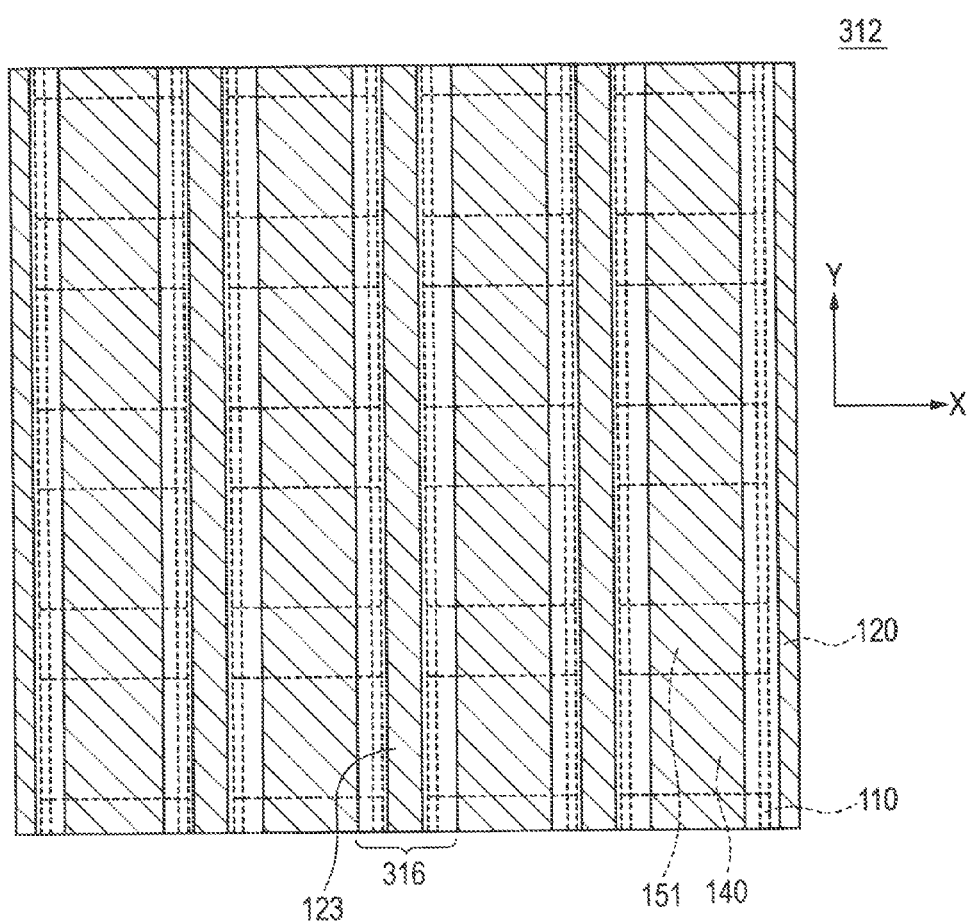
FIG. 29 is a view illustrating a second example of the layout of the first source wiring in the semiconductor device illustrated in FIG. 27.

FIG. 27 is a view illustrating the structure of a semiconductor device 10 according to an eighth embodiment of the invention. FIGS. 28 and 29 are each a view illustrating a layout of a first source wiring 312 of the semiconductor device 10 illustrated in FIG. 27. The semiconductor device 10 according to the embodiment has the same structure as the semiconductor device according to any one of the first to seventh embodiments except matters described below. FIGS. 27 and 28 illustrate a case where the layout of a gate electrode 120, an n-type source layer 140 and a p-type layer 151 is equivalent to that of the first embodiment. FIG. 29 illustrates a case where the layout of the gate electrode 120, the n-type source layer 140 and the p-type layer 151 is equivalent to that of the fourth embodiment.

First, openings 316 are linearly made over the gate electrode 120. Inside the openings 316, a wiring 123 is formed. The wiring 123 is positioned at the same level at which a first source wiring 312 is formed. As viewed in plan, the wiring 123 is overlapped with the gate electrode 120. The wiring 123 is coupled through contacts 305 with the gate electrode 120. The wiring 123 is coupled with the same gate wiring 122 as shown in FIG. 4.

The embodiment can also produce the same advantageous effects as the first embodiment. Moreover, signals can be inputted from the wiring 123 through the contacts 305 into plural sites of the gate electrode 120; thus, in the gate electrode 120, the resistance loss of the signals can be reduced.

Ninth Embodiment

FIG. 30 is a view illustrating the structure of a semiconductor device 10 according to a ninth embodiment of the invention. The semiconductor device 10 according to the embodiment is the same as any one of the first to eighth embodiments except that the device 10 has an IGBT (insulated gate bipolar transistor) 22 instead of the vertical MOS transistor 20. The IGBT 22 has a structure in which a p-type collector layer 134 is added to the vertical MOS transistor 20 to be arranged between the n-type drain layer 130 and the drain electrode 202 of the transistor 20.

In the embodiment, a sub-substrate 102 is a p-type silicon substrate, and functions as a p-type collector layer 134. The n-type drain layer 130 and an n⁻ layer 132 are formed over the sub-substrate 102 by epitaxial growth technique.

A method of manufacturing the semiconductor device 10 according to the embodiment is equivalent to the method of manufacturing the semiconductor device 10 according to the first embodiment except that a p-type silicon substrate is used as the sub-substrate 102, and the n-type drain layer 130 and the n⁻ layer 132 are epitaxially grown in this order over the sub-substrate 102.

The embodiment can also produce the same advantageous effects as the first embodiment.

The above has described embodiments of the invention; however, these embodiments are mere examples of the invention. Thus, the invention may be formed to have various structures other than the above-mentioned structures.

What is claimed is:

1. A method of manufacturing a semiconductor device, comprising the steps of:
   forming, in a semiconductor substrate having at least two surfaces opposite to each other, a vertical transistor comprising a gate electrode and a source layer at one surface side of the two surface sides of the semiconductor substrate, and comprising a drain layer at the other surface side of the semiconductor substrate;
   forming a first interlayer dielectric film over the one surface of the semiconductor substrate;
   forming, in the first interlayer dielectric film, a contact coupled with the source layer of the vertical transistor;
   forming, over the first interlayer dielectric film, a first source wiring overlapped with the vertical transistor as viewed in plan and coupled with the contact, and further making openings in the first source wiring; and
   conducting a treatment with a reducing gas, thereby subjecting the vertical transistor to a first reducing treatment
   wherein the semiconductor substrate comprises a power control region where the vertical transistor is to be formed, and a logic region where a logic circuit is to be formed,
   the method further comprising, before the step of forming the first interlayer dielectric film, a step of:
   forming a planar MOS transistor configured as the logic circuit in the one surface of the logic region of the semiconductor substrate,
   the method further comprising, after the step of conducting the first reducing treatment, the steps of:
   forming a second interlayer dielectric film over the first interlayer dielectric film and the source wiring;
   burying a first via to be coupled with the first source wiring in the second interlayer dielectric film;
   forming, over the second interlayer dielectric film, a second source wiring to be positioned in the power control region and to be coupled with the first via, and a logic wiring to be positioned in the logic region; and
   conducting a treatment with a reducing gas, thereby subjecting the vertical transistor to a second reducing treatment,
   the logic wiring being lower in density than the second source wiring.

2. The method according to claim 1, wherein as viewed in plan, the openings are overlapped with the gate electrode.

3. The method according to claim 1, wherein the interval between any adjacent two of the openings is 20 μm or less.

* * * * *